(12) United States Patent
Yamada et al.

(10) Patent No.: US 7,026,651 B2
(45) Date of Patent: Apr. 11, 2006

(54) LIGHT EMITTING DEVICE HAVING A PSEUDO-CONTINUOUS SPECTRUM AND LIGHTING APPARATUS USING THE SAME

(75) Inventors: Masato Yamada, Annaka (JP); Masanobu Takahashi, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/629,737

(22) Filed: Jul. 30, 2003

(65) Prior Publication Data
US 2004/0026683 A1  Feb. 12, 2004

(30) Foreign Application Priority Data
Jul. 31, 2002 (JP) ............................... 2002-224250
Mar. 7, 2003 (JP) ............................... 2003-061684

(51) Int. Cl.
*H01L 27/15* (2006.01)
*H01L 31/12* (2006.01)
*H01L 33/00* (2006.01)

(52) U.S. Cl. ........................ 257/79; 257/89; 257/94; 257/96

(58) Field of Classification Search ........... 257/79–103
See application file for complete search history.

(56) References Cited

U.S. PATENT DOCUMENTS

| | | | |
|---|---|---|---|
| 5,684,309 A * | 11/1997 | McIntosh et al. ............ 257/191 |
| 6,153,894 A * | 11/2000 | Udagawa ...................... 257/96 |
| 6,163,038 A * | 12/2000 | Chen et al. .................. 257/103 |
| 6,236,067 B1 * | 5/2001 | Shakuda et al. ............. 257/103 |
| 6,542,526 B1 * | 4/2003 | Niwa et al. .................... 372/45 |
| 6,577,073 B1 * | 6/2003 | Shimizu et al. ............. 315/246 |
| 6,608,328 B1 * | 8/2003 | Kuo et al. ..................... 257/79 |
| 6,620,643 B1 * | 9/2003 | Koike .......................... 438/30 |
| 6,657,234 B1 * | 12/2003 | Tanizawa ...................... 257/79 |
| 2004/0056258 A1 * | 3/2004 | Tadatomo et al. ............ 257/79 |

FOREIGN PATENT DOCUMENTS

JP  2002-176198  6/2002

\* cited by examiner

*Primary Examiner*—Mary Wilczewski
*Assistant Examiner*—Monica Lewis
(74) *Attorney, Agent, or Firm*—Snider & Associates; Ronald R. Snider

(57) ABSTRACT

A light emitting device capable of readily produce a pseudo-continuous spectrum covering a wide wavelength regions at low costs, and of totally solving various problems which have resided in the conventional light sources, and a lighting apparatus using this device is provided. The light emitting device 10 is configured so that an active layer in a double hetero light emitting layer portion composed of compound semiconductors comprises a plurality of emission unit layers differing from each other in band gap energy, and so as to emit a simulatively synthesized light having a pseudo-continuous spectrum ensuring an emission intensity of 5% or more of a peak intensity over a wavelength region of 50 nm or more.

16 Claims, 24 Drawing Sheets

DIRECTION OF LIGHT EXTRACTION

DIRECTION OF LIGHT EXTRACTION

LIGHT EMITTING DEVICE HAVING A PSEUDO-CONTINUOUS SPECTRUM AND LIGHTING APPARATUS USING THE SAME

RELATED APPLICATION

This application claims the priorities of Japanese Patent Application Nos. 2002-224250 filed on Jul. 31, 2002 and 2003-061684 filed on Mar. 7, 2003.

BACKGROUND OF THE INVENTION

1. Field of the Invention

This invention relates to a light emitting device and a lighting apparatus using the light emitting device.

2. Description of the Related Art

Incandescent bulbs have long been used as a light source for lighting, and in more earlier times before the incandescent bulbs are invented, natural combustion light such as candles or torches had been used. Incandescent bulbs which illuminate based on resistance heat generation of the filaments suffer from a relatively short service life and a low efficiency due to a large Joule heat loss. They are also disadvantageous in that a large amount of infrared radiation emitted together with visible light during the light emission, and this considerably raises temperature of the light source. Natural combustion lights suffer from further shorter service life, and require labor-consuming maintenance works due to production of large amount of combustion products such as soot and carbon dioxide.

On the other hand, fluorescent lamps have been used as a general light source for lighting other than incandescent bulbs. The fluorescent lamp generates hot electrons in an evacuated glass tube filled with a trace amount of mercury gas by applying a high voltage between the electrodes enclosed therein, allows mercury to be excited by the hot electrons so as to emit ultraviolet radiation, and allows a fluorescent material coated on the inner surface of the glass tube to illuminate based on photoluminescence using the ultraviolet radiation. While the emission having a variety of spectra can be obtained by selection of fluorescent materials to be used, most popular fluorescent material is calcium halophosphate ($3Ca_3(PO_4)_2 \cdot CaFCl/Sb, Mn$), where white light having various color temperatures can be obtained by typically adjusting ratios of F and Cl, or that of Sb and Mn. The fluorescent lamps have replaced the incandescent bulbs in most part of the applications where use of the incandescent bulbs was prevailing in the past.

The fluorescent lamps, however, still suffer from the following drawbacks:

the service life tends to terminate relatively within a short time due to evaporative consumption of the electrodes since ultraviolet radiation is generated by cathode discharge;

although power consumption is smaller than that of incandescent bulbs, it is still not ignorable because high voltage is necessary;

it is expected to be disused from the viewpoint of environmental preservation because disposal thereof releases mercury filled in the glass tube as a ultraviolet emission source;

leakage of ultraviolet radiation tends to cause yellowing of papers or the like; and phosphorescent light obtained from calcium halophosphates is substantially white, but the spectrum thereof largely differs from that of natural light (sunlight), and thus raises a problem of color rendering properties.

Even an effort of realizing more excellent color rendering properties by combining narrow-range light emissions in three wavelength regions for red, green and blue (RGB) still remains a large gap to the natural light in terms of the color rendering properties due to sharp peaky bright line spectra of the fluorescent materials of the individual colors.

Light emitting diodes are also known as a light emitting source. Light emitting diodes, however, have only limited emission wavelength regions which are governed by band gap values of semiconductors to be used, and this makes it impossible to obtain an emission spectrum covering a wide visible light band, and emission from most of them is only almost monochromatic. There have thus been almost no applications of the light emitting diodes in the field of general lighting where color rendering properties are required. Recent development of a high-luminance blue emission device using InGaAlN-base compounds has made it possible to develop various light emitting devices capable of emitting a variety of mixed colors, which are based on combination of light emitting devices causing red, green and blue monochromatic lights corresponding to three principal colors of light, intended for use in lighting. This kind of devices, however, raise a problem that they can produce only extremely discrete emission spectra characterized by sharp peaky bright lines, and consequently that they are poor in color rendering properties for the intermediate wavelength regions.

It is therefore a subject of this invention to provide a light emitting device capable of readily produce a pseudo-continuous spectrum covering a wide wavelength region at low costs, and of totally solving various problems which have resided in the conventional light sources, and a lighting apparatus using this device.

DISCLOSURE OF THE INVENTION

As a solution to the aforementioned subject, a light emitting device of this invention is to cause emission output of a light having a pseudo-continuous spectrum obtained by synthesizing a plurality of emissions differing in peak wavelength so as to ensure an effective wavelength region showing an emission intensity of 5% or more of a reference intensity over a wavelength region of 50 nm or more, the reference intensity being defined as an emission intensity at a peak wavelength in the synthesized spectrum. A lighting apparatus of the invention comprises the light emitting device of the invention and a power supply portion for supplying emission drive power to the light emitting device, and configured so as to extract visible light from the light emitting device as an illumination light.

The light emitting device of the invention can simulatively synthesize a continuous spectrum having a wide wavelength range (more specifically, having an effective wavelength region of 50 nm or more) by combining a plurality of light emission differing from each other in the peak wavelength (also referred to as "emission unit", hereinafter) generated based on quantum-optical, light-emissive recombination of the carriers. Conventional semiconductor light emitting devices causing nearly monochromatic emission typically show a peak having a half value width of 20 nm or around, and assuming now an emission intensity at the peak wavelength as a reference intensity, the effective wavelength region showing an emission intensity of 5% or more of the reference intensity is generally as narrow as 40 nm or less. It is, therefore, absolutely impossible for the conventional semiconductor light emitting device to output a continuous spectrum having a width of the effective wavelength region of 50 nm or more. For an exemplary case of illumination light, it is generally considered that the wavelength region in which the emission intensity falls below 5% of the reference intensity hardly contributes the brightness or color rendering properties of the illumination. The light emitting device of the invention, however, can readily synthesize an emission spectrum in such effective wavelength region based on various combinations of the emission units. Another advantage resides in that use of the semiconductor light emitting devices as a light source can suppress time-dependent degradation and thus ensure a long service life, and the circuit configuration can be simplified because it basically requires only a power supply circuit for continuous emission. No need of a high voltage and a small resistance loss also ensure a small power consumption. No need of mercury, unlike fluorescent lamps, realizes an ecologically clean light emitting device.

Although combination of RGB monochromatic lights may apparently produce synthetic emission colors having a variety of color tones if intensity ratio is properly adjusted, thus-obtained spectra are no more than gathering of bright lines based on combinations of RGB monochromatic colors, and are not capable of rendering subtle lighting effect owned by continuous spectra. On the other hand, the invention can ensure the effective wavelength region showing an emission intensity of 5% or more of the reference intensity over a range of as wide as 50 nm or more by combining monochromatic emissions having intervals narrower than those of RGB monochromatic colors, so that subtle lighting effect owned by continuous spectra can closely be resembled nonetheless the resultant spectrum is still a simulative synthetic one. In particular, a pseudo-continuous spectrum showing an emission intensity of 10% or more (preferably 15% or more) of the reference intensity over a range of as wide as 50 nm or more (preferably 100 nm or more) can readily be realized by the light emitting device of the invention, but this cannot be realized by the conventional combination of RGB monochromatic colors.

Wavelength range of light to which the invention is applicable is the visible region (360 nm to 700 nm) for example for illumination. That is, the invention can provide the above-described light showing a pseudo-continuous spectrum as visible light, and can provide the device having the effective wavelength range as wide as 50 nm or more within the visible light region. This makes it possible to realize desired visible continuous spectral profile for illumination or the like, without limitations. It is to be understood that the invention is not limited for use in illumination, but is applicable also to wavelength regions including ultraviolet or infrared regions. The description hereinafter will, however, representatively be made on wavelength regions mainly including the visible region.

The light emitting device of the invention is configured so that the active layer of the double hetero light emitting layer portion composed of compound semiconductors comprises a plurality of emission unit layers differing from each other in band gap energy, so as to allow the emission unit layers to effect emission output of the light having a pseudo-continuous spectrum based on combination of light emission from the individual emission unit layers. In the light emitting layer portion having a double heterostructure (double hetero light emitting layer portion) composed of compound semiconductors, the cladding layers on both sides of the active layer can function as barriers against the carriers, and the confinement effect thereof ensures light emission at a high efficiency. In the above-described configuration, the active layer of such double hetero light emitting layer portion has further fabricated therein a plurality of emission unit layers differing from each other in the band gap energy, and the continuous spectrum is simulatively synthesized based on combinations of emissions from the individual emission unit layers (also referred to as "emission unit", hereinafter). Because the above-described configuration uses such active layer having a plurality of emission unit layers differing from each other in the emission wavelength fabricated therein (also referred to as "composite active layer", hereinafter), only a small number of devices can successfully realize the pseudo-continuous spectrum in which a plurality of emission wavelengths are synthesized. This can also simplify the light source and peripheral circuit therefor to a considerable degree, and can realize a lighting apparatus having advanced performances and a small power consumption at low coasts. Combination of the emission unit layers having emission wavelengths outside the infrared region is effective for the case where infrared emission is to be suppressed, and combination of those having emission wavelengths outside the ultraviolet region is effective for the case where a device having a suppressed ultraviolet radiation is desired.

Incandescent bulbs and fluorescent lamps emit a considerable amount of infrared radiation (heat ray) and ultraviolet radiation, respectively, for the inevitable reasons ascribable to their emission principles. On the other hand according to the light emitting device of the invention, combination of the emission units having emission wavelengths outside the infrared region can readily obtain a pseudo-continuous spectrum containing no infrared components of 710 nm or longer, and combination of those having emission wavelengths outside the ultraviolet region can readily obtain a pseudo-continuous spectrum containing no ultraviolet components of 350 nm or shorter. That is, the invention can suppress, in a simple and effective manner, the infrared and ultraviolet radiations which have not been avoidable with the conventional incandescent bulbs and fluorescent lamps. Although emission spectra from the individual emission unit layers composed of compound semiconductors generally show peak forms having narrow half value widths, the background region may inevitably contain a trace amount of infrared or ultraviolet emission component. It is to be understood that such inevitable infrared or ultraviolet emission component is assumed as being "not contained" in the context of the invention unless otherwise the component is intentionally utilized.

The light emitting device of the invention is characterized in that an analog-like continuous spectrum covering a broad wavelength range, such as that obtained by heat-radiation light source, can be synthesized in a digital-like manner by combining light emission units having a variety of wavelengths in various intensities. Just like that digital image having a low quantization level (low resolution) has jaggy on its contour, also the pseudo-continuous spectrum synthesized by the light emitting device of the invention may suffer from ripple corresponded to the individual discrete emission peaks if intervals in the wavelength of the individual light emission units are too large. It is therefore preferable to narrow as possible the wavelength intervals of the individual emission units in order to obtain a smooth continuous spectrum. More specifically, it is preferable to align a plurality of emission unit layers according to an order of magnitude of the band gap energy such as ensuring a difference of 0.42 eV or less between every adjacent band gap energies, and more preferably 0.2 eV or less. Although a smaller difference value will result in a smoother spectral waveform, excessively small difference inevitably increases the number of necessary emission unit layers, and dramatically increases the production cost. It is to be also remembered that distance between the adjacent peak wavelengths ascribable to the individual emission units for forming the pseudo-continuous spectrum smaller than the spectral half value width will result in excessively large overlapping of the adjacent spectral peaks, which is wasteful. Considering now that the spectral half value width of the emission unit is 20 nm or around, it is preferable to adjust the difference between every adjacent band gap energies to 0.05 eV or larger.

One possible visible continuous spectrum to be modeled upon is a continuous spectrum obtained from a heat-radiation light source. The heat-radiation light sources have different emission spectra depending on temperature of the light sources. Most light sources used for illumination such as incandescent bulbs (around 3,000 K) and combustion light (around 1,500 K) are seen as being colored in yellow or orange, because the light source temperatures thereof are not so high as sunlight. It is, however, generally known that color rendering properties are not so severe as being expected from such coloring of the light sources. This is contributed by two matters; the first is adaptation of the eyes; and the second is a fact that even a spectrum caused by a relatively cool heat-radiation light source covers visible wavelength components over a relatively wide wavelength range. To obtain a pseudo-continuous spectrum not largely differing from real heat-radiation light sources on the visual basis, it is preferable, in particular from the latter point of view, that visible light components over a wide wavelength range as possible are contained in the spectrum. More specifically, it is preferable that the effective wavelength region showing an emission intensity of 5% or more of a reference intensity is ensured over a range from 500 nm to 600 nm, both ends inclusive. The effective wavelength region narrower than this range may considerably ruin the color rendering properties of illumination. The effective wavelength region is more preferably ensured over a range from 470 nm to 650 nm, and still more preferably from 400 nm to 670 nm. It is also preferable in view of obtaining a smooth spectral waveform and improving the color rendering properties that the effective wavelength region of the pseudo-continuous spectrum is synthesized by 4 or more emission unit layers (or the total number of the emission unit layers when two or more devices are combined as described later) differing with each other in the emission wavelength.

In this case, it is effective, in view of reproducing real colors of the light sources, to minimize the above-described ripple in the spectral waveform as possible in the pseudo-continuous spectrum to be realized by the light emitting device of the invention. More specifically, assuming now on a spectral waveform shown in FIG. 35, a first tangent line "A" is drawn so as to pass two adjacent small peaks which form valleys in the ripple curve, and a second tangent line "B" is then drawn in parallel to the tangent line "A" so as to pass the valleys of the ripple curve, where distance between these tangent lines in the direction of the axis of intensity is defined as ripple depth d. Also assuming now that line V which passes the bottom of a ripple valley is drawn in parallel to the axis of intensity, where intersection Q of the line V with the first tangent line "A" is defined to express the reference intensity H for the ripple in focus. To realize a smooth pseudo-continuous spectrum, it is preferable that the ripple ratio R defined by d/H is suppressed to a sufficiently low level over the entire range of the effective wavelength region, where the value of which is typically 0.1 or less. In the specification, it is assumed that two adjacent peaks which form valleys in the ripple curve are negligible in the effective wavelength region of the pseudo-continuous spectrum if the ripple ratio R is suppressed to as low as 0.1 or less.

For the case where a pseudo-continuous spectrum simulating that of natural light or heat-radiation light source is to be synthesized by the light emitting device of the invention, the obtained spectrum is preferably a broad continuous spectrum having a single peak over the effective wavelength region, or such as having a monotonously increasing or decreasing intensity along with the wavelength over the effective wavelength region.

FIG. 17 shows a spectrum of the natural light (sunlight), where a peak is seen at around 400 nm, which is ascribable to a light source temperature as very high as 6,000 K, and the intensity monotonously decreases as the wavelength increases. In contrast to this, a spectrum of an incandescent bulb shown in FIG. 18 has a peak on the longer wavelength side at around 700 nm, which is ascribable to a light source temperature as low as 3,000 K, and the intensity monotonously increases as the wavelength increases. Any spectrum ascribable to a light source temperature between 3,000 K and 6,000 K will have a peak within the above effective wavelength region as a natural consequence, and, as shown in FIG. 34, the obtained spectrum will be such as having a broad intensity distribution expressed by a single peak in the effective wavelength region. In the light emitting device of the invention, a pseudo-continuous spectrum having a spectral waveform with a ripple ratio of 0.1 or less can readily be realized by aligning a plurality of emission unit layers according to an order of magnitude of the band gap energy so as to ensure a difference of 0.2 eV or less between every adjacent band gap energies. The light emitting device of the invention can thus successfully reproduce real emission spectra of the natural light and heat-radiation light sources which have never been achievable based on the RGB combination by using the conventional fluorescent lamps even if they are characterized as a "high-color-rendering-type".

The double hetero light emitting layer portion can typically be composed of Group II-V compound semiconductors or Group II-VI compound semiconductors, where the emission wavelength of the emission unit layers included in the active layer is adjustable based on alloy compositions of the alloyed compound semiconductors for composing the emission unit layers.

It is to be noted that the wavelength region to which the invention is applied is, of course, not limited to those ascribable to heat-radiation light sources. For example, heat-radiation light source can cover a wide wavelength range from blue light (or blue-green) to red light, and if some visible light in the blue region is excluded from the emission spectrum of an incandescent bulb, the residual wavelength region is still enough to simulatively realize an illumination color specific to the incandescent bulb, in which yellow to orange color is prevailing. In this case, the double hetero light emitting layer portion can typically be composed of $(Al_xGa_{1-x})_yIn_{1-y}P$ (where, $0 \leq x \leq 1$ and $0 \leq y \leq 1$). By adjusting alloy compositions x and y, the device can readily be adjusted in the emission wavelength while keeping high intensity over a range from 550 nm to 670 nm. Omission of blue wavelength region may even create a curious effect not obtainable by the general incandescent bulbs.

On the contrary, omission of light in the red wavelength region from a spectrum, such as sunlight, in which intensity of the blue wavelength components is relatively large will result in a special color rendering effect in which bluish tone is prevailing. Anyway, both cases ensure pseudo-continuous spectra having the effective wavelength region as wide as 50 nm or more, the illumination color will never be monotonous nor unnatural unlike that of monochromatic light, and will have excellent color rendering properties. More specifically, the double hetero light emitting layer portion can be composed of $In_aGa_bAl_{1-a-b}N$ (where, $0 \leq a \leq 1$, $0 \leq b \leq 1$ and $a+b \leq 1$, also expressed as InGaAlN, hereinafter). By adjusting alloy compositions "a" and "b", the device can readily be adjust in the emission wavelength while keeping high intensity over a range from 360 nm to 560 nm.

AlGaInP and InGaAlN are advantageous in that they have emission drive voltages of as low as 2 V or around and 3 V or around, respectively, in that they can produce emission intensity bright enough for use in illumination as being supplied with a current only as small as 50 to 800 mA, in that the drive circuit therefor can be simplified, and in that they have small power consumption.

On the other hand, for the case where a light emitting device having more wider effective wavelength region is to be realized, it may not always be possible to cover the entire wavelength region, with a single species of compound semiconductor system, while keeping a sufficient emission intensity. It is therefore successful to use different species of compound semiconductor systems as being suited to target wavelength regions. More specifically, a plurality of devices, having the double-hetero light emitting layer portions composed of different compound semiconductor systems, are combined so as to synthesize and output the emission spectra from the individual devices. By configuring the individual devices based on proper selection of compound semiconductor systems which is advantageous in ensuring emission intensity as suited for target wavelength regions, necessary and sufficient emission intensity can readily be ensured according to the waveform of desired pseudo-continuous spectrum in any wavelength regions. In this case, the number of necessary devices can successfully be reduced if at least one of such plurality of devices is configured as having a composite active layer in which a plurality of emission unit layers are integrated.

One specific example of the separate-type configuration using a plurality of devices is such as having a first device and a second device as combined therein, where both devices respectively have a double-hetero light emitting layer portion composed of compound semiconductors, the first device has an emission wavelength of an emission unit layer contained in an active layer in the double hetero light emitting layer portion of 520 nm to 700 nm, both ends inclusive, and the second device has an emission wavelength of the same of 360 nm to 560 nm, both ends inclusive, and at least either of the first device and second device includes a plurality of the emission unit layers in the active layer. The visible light region extends over a relatively wide range from 360 nm to 700 nm, and this wide range can be covered only by a band gap widely variable from 1.75 eV to 3.2 eV. On the other hand, most of the currently available compound semiconductors for use in light emitting devices are such as ensuring high emission intensity only on either of the longer wavelength side (520 nm to 700 nm) and the shorter wavelength side (360 nm to 560 nm). Combination of these two types of devices can effectively cover almost entire portion of the visible light region, where effect of reducing the number of necessary devices becomes large because only two types of devices are necessary. Wavelength regions of these two types of the devices herein are defined so as to commonly cover the green wavelength region from 490 nm to 560 nm, which is a region most popularly contained in spectra of heat-radiation light sources. The coverage of the green region by two types of devices is advantageous in realizing a pseudo-continuous spectrum having a smoother waveform, less band omission and high quality. The first device can specifically be configured so that the double hetero light emitting layer portion thereof is composed of $(Al_xGa_{1-x})_yIn_{1-y}P$ (where, $0 \leq x \leq 1$ and $0 \leq y \leq 1$). The second device can be configured so that the double hetero light emitting layer portion thereof is composed of $In_aGa_bAl_{1-a-b}N$ (where, $0 \leq a \leq 1$, $0 \leq b \leq 1$ and $a+b \leq 1$).

The double hetero light emitting layer portion can also be composed of GaAlAs (coverable wavelength region from 640 nm to 700 nm), which is a Group III-V compound semiconductor capable of covering longer wavelength regions. On the other hand, the double hetero light emitting layer portion composed of $Mg_aZn_{1-a}O$-type oxide (where, $0 \leq a \leq 1$), SiC or Group II-VI compound semiconductors such as ZnSe can provide the light emitting device capable of covering shorter wavelength regions.

BEST MODES FOR CARRYING OUT THE INVENTION

The following paragraphs will describe embodiments of the invention referring to the attached drawings.

Figure 1:
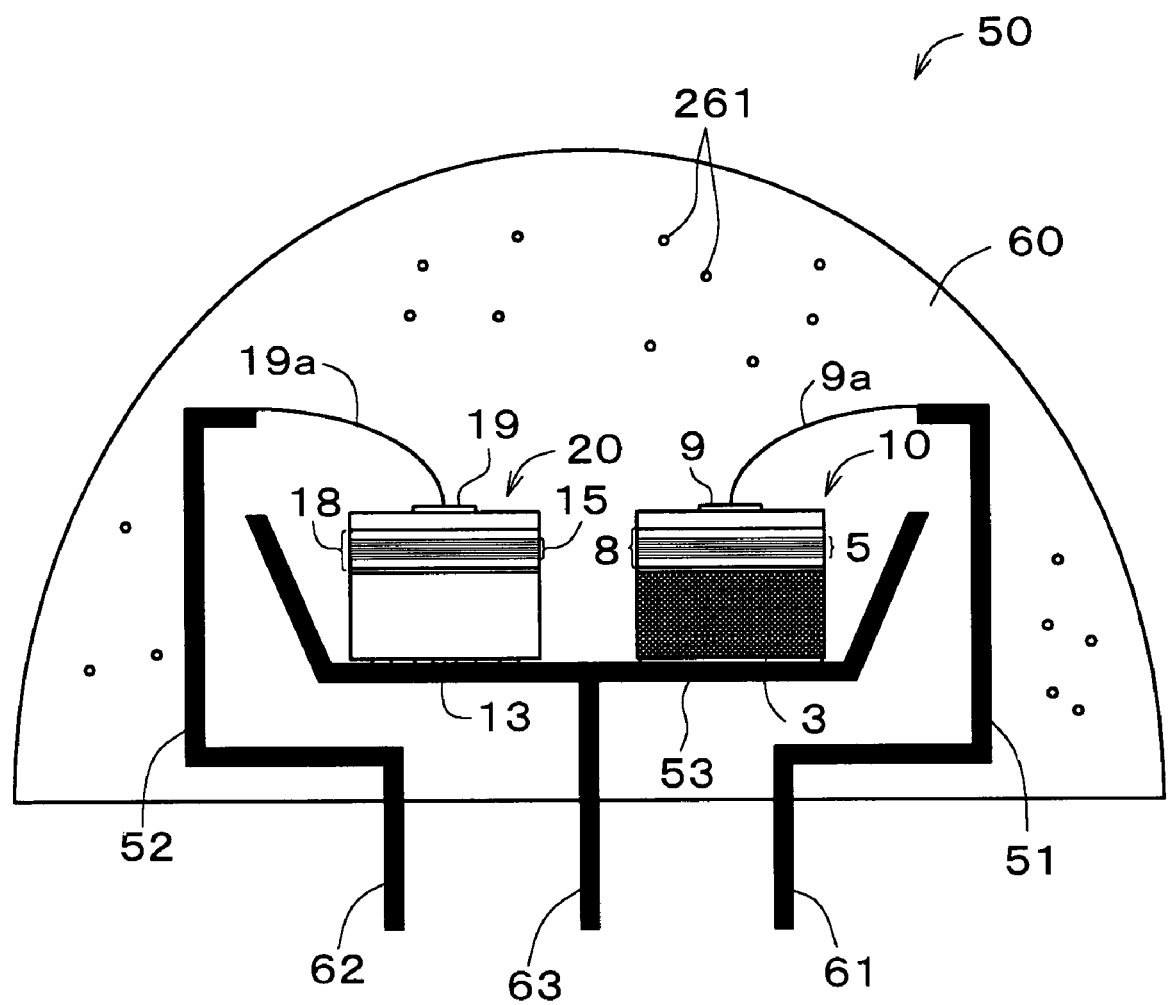
FIG. 1 is a schematic drawing of an exemplary light source module using a light emitting device of the invention.

FIG. 1 is a schematic drawing of an exemplary light source for illumination using a light emitting device according to one embodiment of the invention. The light source for illumination 50 has light emitting devices 10, 20 according to a concept of the invention. The light emitting devices 10, 20 are specifically a first device 10 and a second device 20, where active layers (see FIGS. 2 and 3) of double hetero light emitting layer portions 8, 18 (simply referred to as "light emitting layer portions", hereinafter), which are composed of compound semiconductors, are respectively configured so as to include a plurality of emission unit layers differing from each other in the band gap energy. Emission wavelength of the emission unit layers of the first device 10 is set within a range from 520 nm to 700 nm, both ends inclusive, and that of the second device 20 is set within a range from 350 nm to 560 nm, both ends inclusive. The light source for illumination 50 mixes the emission from these two devices 10, 20 to thereby simulatively synthesize a continuous spectrum such as being obtainable from heat radiation light sources, and output the synthesized light as a visible light having a pseudo-continuous spectrum.

Figure 2:
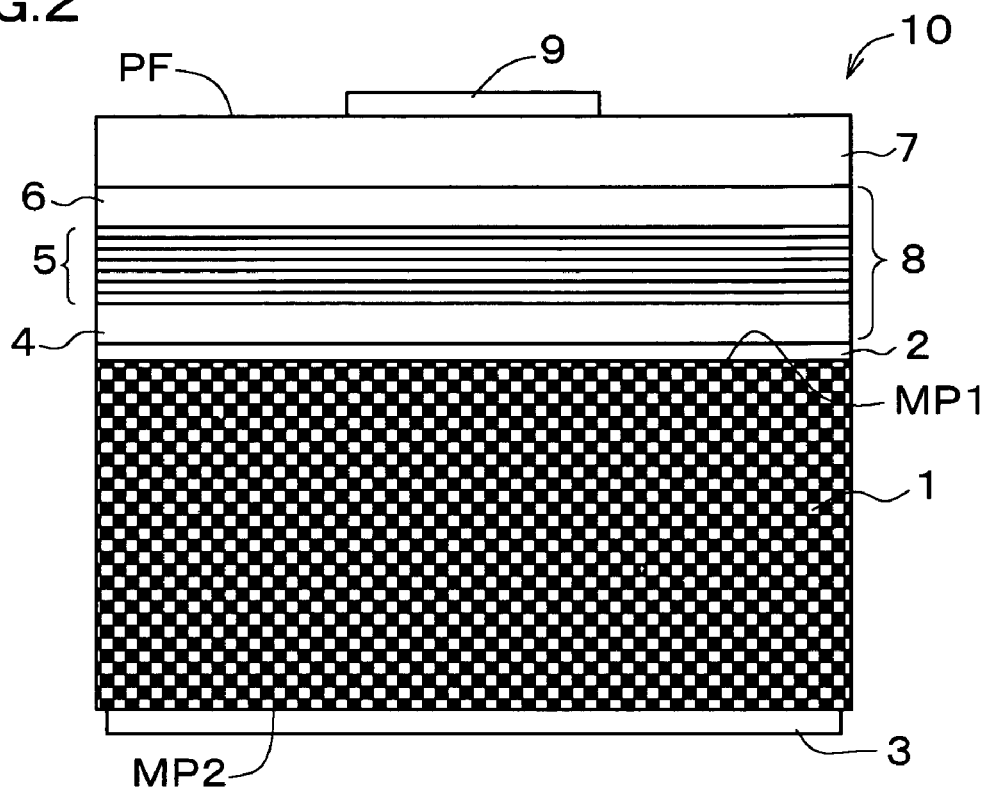
FIG. 2 is a schematic drawing of an exemplary overall configuration of the first light emitting device.

FIG. 2 shows an exemplary stacked structure of the first device 10. The first device 10 comprises an n-type GaAs single crystal substrate (simply referred to as a "substrate", hereinafter) 1, and a light emitting layer portion 8 formed on a first main surface MP1 thereof. More specifically, an n-type GaAs buffer layer 2 is formed in contact with the first main surface MP1 of the substrate 1, and on the buffer layer 2, the light emitting layer portion 8 is formed. Further on the light emitting layer portion 8, a current spreading layer 7 is formed, and further on the current spreading layer 7, a first electrode 9 for applying light emission drive voltage to the light emitting layer portion 8 is formed. On a second main surface MP2 side of the substrate 1, a second electrode 3 is formed over the entire portion thereof. The first electrode 9 is formed approximately at the center of the first principal face PF of the first device 10, where the area around the first electrode 9 serves as an area for extracting light emitted from the light emitting layer portion 8.

The light emitting layer portion 8 is configured so that an active layer 5 composed of $(Al_xGa_{1-x})_yIn_{1-y}P$ (where, $0 \leq x \leq 0.55$ and $0.45 \leq y \leq 0.55$), typically of non-doped but may be added with a dopant if necessary, is sandwiched by a p-type cladding layer 6 composed of p-type $(Al_zGa_{1-z})_yIn_{1-y}P$ (where, $x<z \leq 1$) and an n-type cladding layer 4 composed of n-type $(Al_zGa_{1-z})_yIn_{1-y}P$ (where, $x<z \leq 1$). In FIG. 2, the p-type AlGaInP cladding layer 6 is disposed on the first electrode 9 side, and the n-type AlGaInP cladding layer 4 is disposed on the second electrode 3 side. The device therefore has positive polarity on the first electrode 9 side. It is to be noted now that "non-doped" in this context means that "the dopant is not intentionally added", and is not precluded from being inevitably added with the dopant component during normal fabrication processes (where the upper limit set at $10^{13}$ to $10^{16}/cm^3$ or around). The current spreading layer 7 is formed as a p-type GaP layer.

Figure 3:
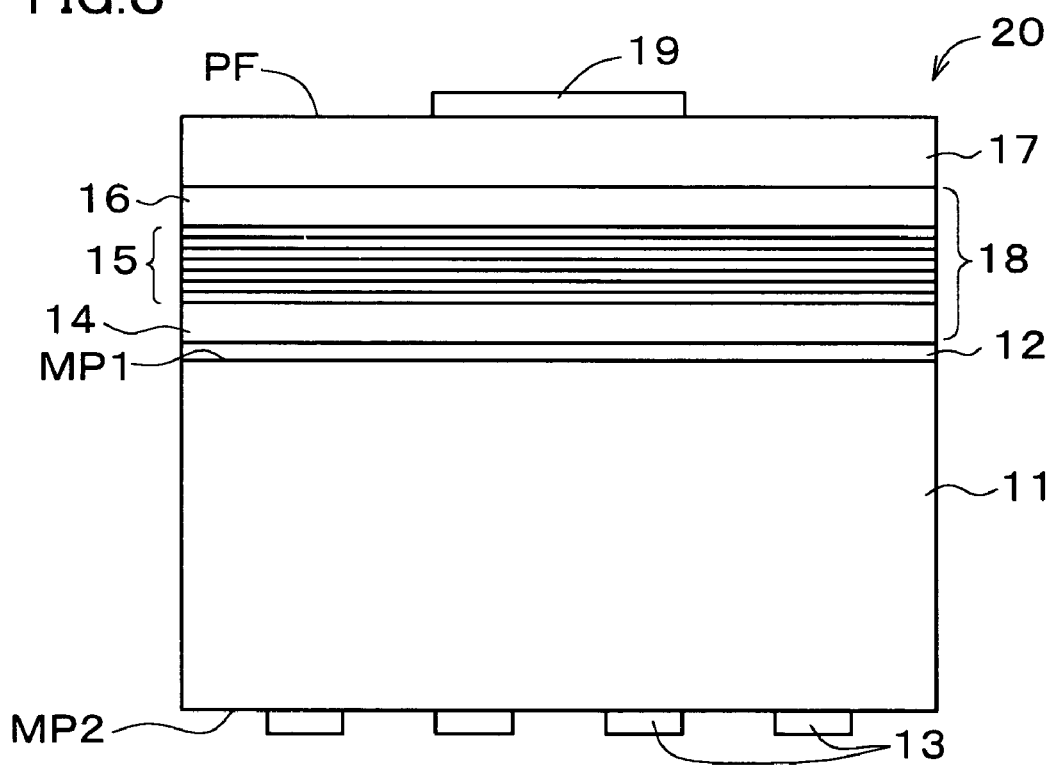
FIG. 3 is a schematic drawing of an exemplary overall configuration of the second light emitting device.

FIG. 3 shows an exemplary stacked structure of the second device 20. The second device 20 comprises an n-type SiC single crystal substrate (simply referred to as a "substrate", hereinafter) 11, and a light emitting layer portion 18 formed on a first main surface MP1 thereof. More specifically, an n-type GaN buffer layer 12 is formed in contact with the first main surface MP1 of the substrate 11, and on the buffer layer 12, the light emitting layer portion 18 is formed. Further on the light emitting layer portion 18, a current spreading layer 17 is formed, and further on the current spreading layer 17, a first electrode 19 for applying light emission drive voltage to the light emitting layer portion 18 is formed. On a second main surface MP2 side of the substrate 11, a second electrode 13 is formed in a discrete manner. The first electrode 19 is formed approximately at the center of the first principal face PF of the second device 20, where the area around the first electrode 19 serves as an area for extracting light emitted from the light emitting layer portion 18.

The light emitting layer portion 18 is configured so that an active layer 15 composed of non-doped $In_aGa_bAl_{1-a-b}N$ alloy is sandwiched by a p-type cladding layer 16 composed of p-type $In_aGa_bAl_{1-a-b}N$ alloy and an n-type cladding layer 14 composed of n-type $In_aGa_bAl_{1-a-b}N$ alloy. In FIG. 3, the p-type InGaAlN cladding layer 16 is disposed on the first electrode 19 side, and the n-type InGaAlN cladding layer 14 is disposed on the second electrode 13 side. The device therefore has positive polarity on the first electrode 19 side. The current spreading layer 17 is formed as a p-type GaN layer.

The individual layers in both devices can epitaxially be grown by any publicly-known metal-organic vapor phase epitaxy (MOVPE) process. It is also allowable to provide a reflective layer between the light emitting layer portions 8, 18 and the substrates 1, 11 in order to enhance intensity of the extracted light.

Figure 4:
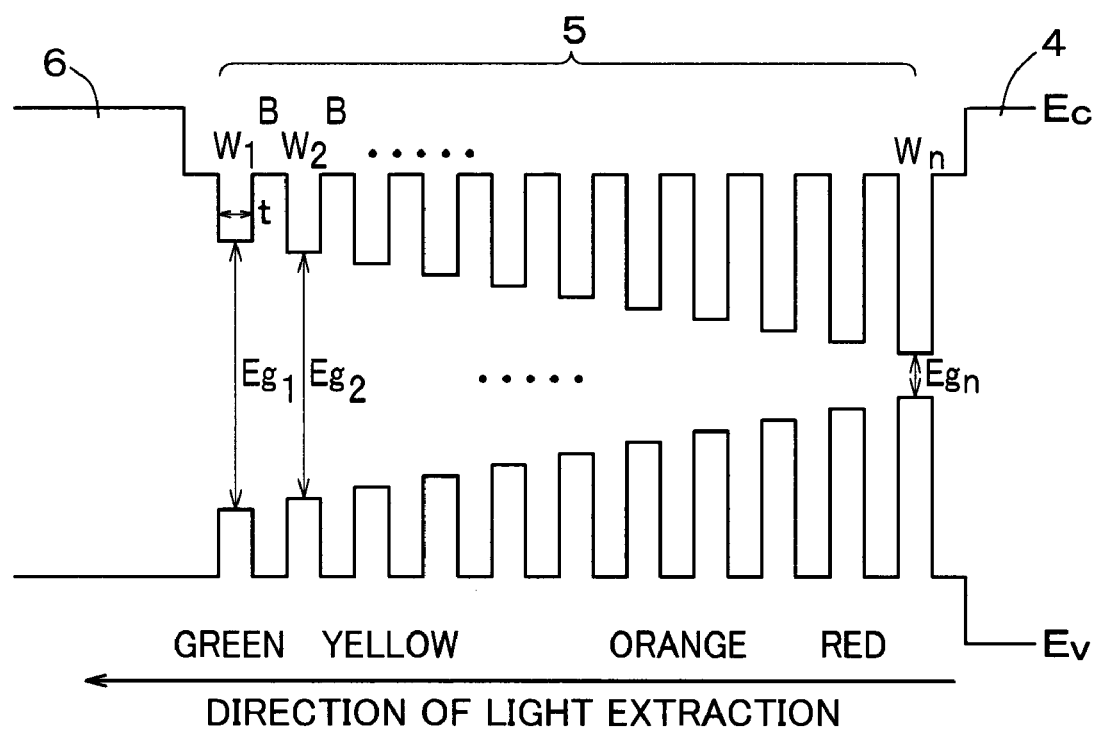
FIG. 4 is a band chart of an exemplary configuration of an active layer of the first light emitting device.
Figure 7:
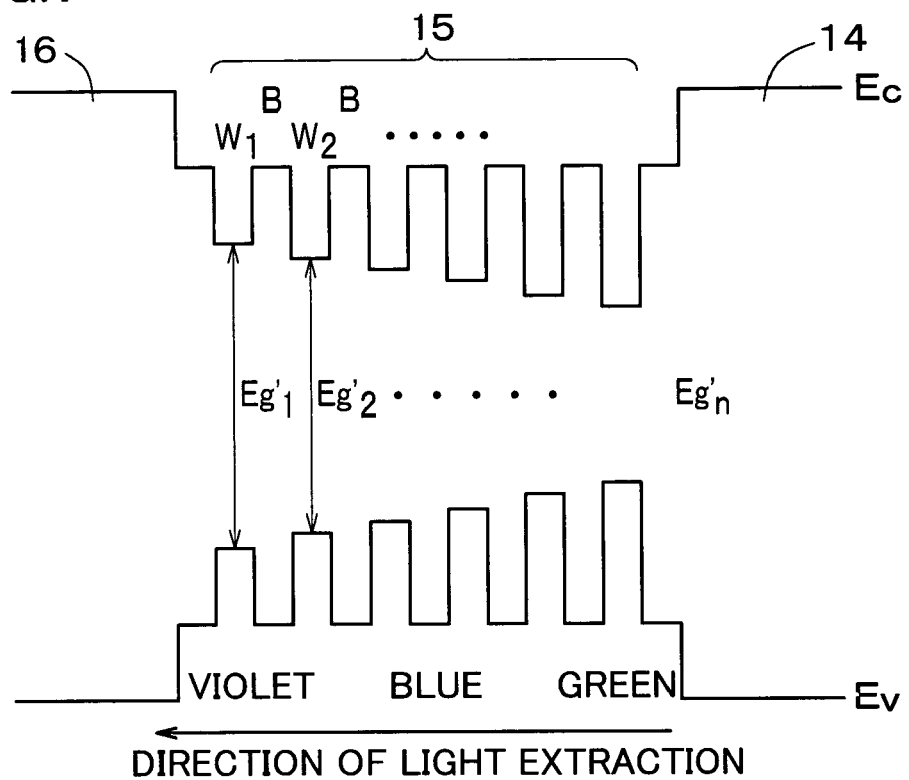
FIG. 7 is a band chart of an exemplary configuration of an active layer of the second light emitting device.

FIG. 4 schematically shows, in a form of band chart, an exemplary structure of the active layer 5 of the first device 10. FIG. 7 schematically shows, in a form of band chart, an exemplary structure of the active layer 15 of the second device 20. In the active layers 5, 15, the emission unit layer comprises well layers W1, . . . , Wn individually sandwiched by two barrier layers B, B. By composing the light emission unit with the well layers W1, . . . , Wn individually sandwiched by two barrier layers B, B, emission efficiency of the individual emission unit layer can successfully be raised by virtue of carrier confinement effect within the well layers. Emission wavelengths of the individual well layers W1, . . . , Wn are determined by the individual band gap energies Eg1, . . . , Egn (FIG. 4), Eg'1, . . . , Eg'n (FIG. 7) (=Ec-Ev for the individual well layers, where Ec is an energy level at the bottom of the conduction band, and Ev is an energy level at the top of the valence band). In the embodiment, all of the well layers W1, . . . , Wn have band gap energies differed from each other, and consequently form separate emission unit layers. That is, a single emission unit layer contains a single well layer. It is, however, to be noted that it is also allowable to compose the emission unit layer by a set of a plurality of well layers having an identical band gap energy. Table 1 shows relations among alloy compositions x, y of $(Al_xGa_{1-x})_yIn_{1-y}P$, obtained band gap energies and emission wavelengths (together with emission color for reference). Alloy composition x is preferably set so as to satisfy x<0.6, because x≧0.6 will result in indirect emission having a lowered emission intensity. Table 2 shows relations among alloy composition "a" of $In_aGa_{1-a}N$, obtained band gap energies and emission wavelengths (together with emission color for reference). It is to be noted now that the band structure is by no means limited to that illustrated in FIG. 4 in which energy level Ec at the bottom of the conduction band in the well layer becomes high as the band gap energy of the well layer increases, and energy level Ev at the top of the valence band becomes low as the band gap energy of the well layer increases. For example, energy level Ev at the top of the valence band may sometimes not correspond with magnitude of the band gap energy in an one-to-one manner depending on composition of the well layer.

TABLE 1

| Xv (Al) | Yv (Al, Ga) | Lattice constant (Å) | Eg (eV) | Wavelength (nm) | Emission color |
|---|---|---|---|---|---|
| 0 | 0.5 | 5.650693 | 1.90110123 | 652.0 | red |
| 0.1 | 0.5 | 5.651336 | 1.9625402 | 631.6 | reddish orange |
| 0.2 | 0.5 | 5.651980 | 2.02397916 | 612.4 | orange |
| 0.3 | 0.5 | 5.652624 | 2.08541812 | 594.4 | yellowish orange |
| 0.4 | 0.5 | 5.653268 | 2.14685709 | 577.4 | yellow |
| 0.5 | 0.5 | 5.653912 | 2.20829605 | 561.3 | yellow-green |
| 0.6 | 0.5 | 5.654556 | 2.26973501 | 546.1 | (yellowish green) |
| 0.7 | 0.5 | 5.655200 | 2.33117397 | 531.7 | (green) |
| 0.8 | 0.5 | 5.655843 | 2.39261294 | 518.1 | (green) |
| 0.9 | 0.5 | 5.656487 | 2.4540519 | 505.1 | (bluish green) |
| 1 | 0.5 | 5.657131 | 2.51549086 | 492.7 | (blue-green) |

TABLE 2

| Xv (In) | Eg (eV) | Wavelength (nm) | Emission color |
|---|---|---|---|
| 0 | 3.4 | 364.5 | (ultraviolet) |
| 0.1 | 3.165 | 391.6 | violet |
| 0.2 | 2.95 | 420.2 | violet |
| 0.3 | 2.755 | 449.9 | blue-violet |
| 0.4 | 2.58 | 480.4 | blue |
| 0.5 | 2.425 | 511.1 | bluish green |
| 0.6 | 2.29 | 541.3 | green |

In both of the first device 10 and second device 20, the plurality of emission unit layers, that are well layers W1, . . . , Wn, are aligned according to an order of magnitude of the band gap energy such as ensuring a difference ΔE of 0.42 eV or less between every adjacent band gap energies, and more preferably 0.2 eV or less. Excessively large difference ΔE of the band gap energy excessively widens peak-to-peak distance of the unit spectra, generates a large waving in a synthesized waveform, and makes it difficult to obtain a smooth spectrum. The difference ΔE can be set identical for every set of emission unit layers corresponded to the adjacent band gap energies, or can be set not identical for at least a part of sets of emission unit layers depending on a desired emission spectral form, such as setting the distance more densely in a wavelength region where the intensity is intentionally raised, or conversely more scarcely in a wavelength region where the intensity is intentionally lowered.

Figure 13:
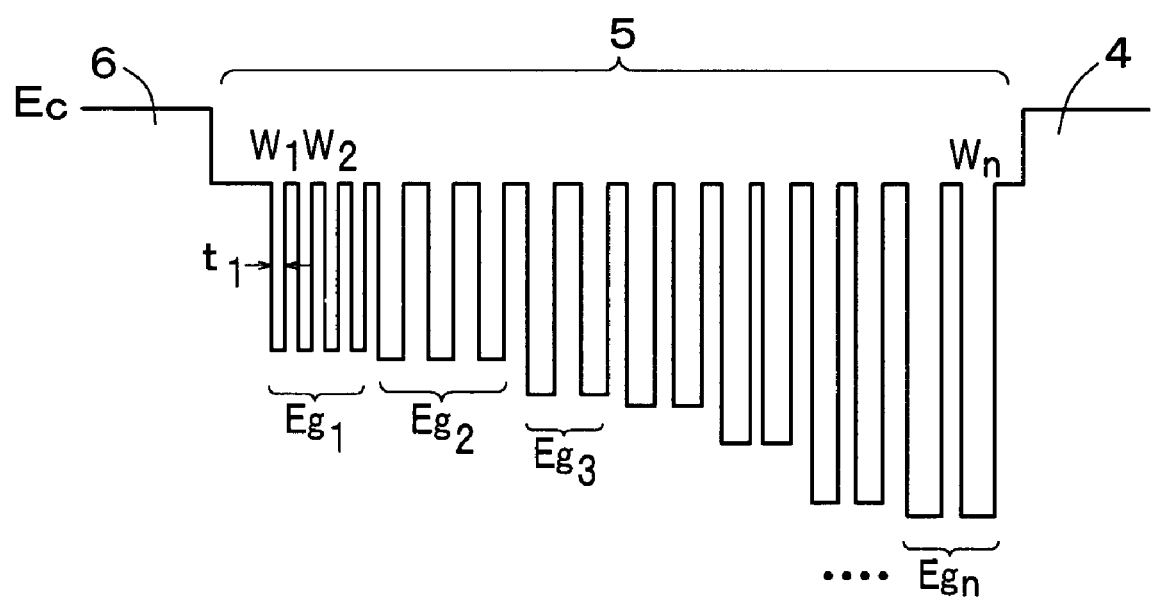
FIG. 13 is a band chart showing the bottom side of the conduction band in the first modified example of the active layer.

The emission intensity of the individual emission unit layers can be adjusted by thickness of the well layers W1, . . . , Wn. For example, for the case where quantum well structure, described later, is not adopted, the emission intensity can be raised with increase of the thickness up to a certain thickness. When the emission unit layer has only a single well layer, the emission intensity can be adjusted by adjusting the thickness of the layer. On the other hand, in place of increasing the thickness of the layer, the emission intensity can also be raised by increasing the number of well layers within a single emission unit layer as shown in FIG. 13, that is, by forming the well layers having a same band gap energy (Eg1, Eg2, . . . , Egn) in a plural number of layers. In other words, the emission intensity of the emission unit layer is also adjustable by the number of the well layers. This constitution is more advantageous in terms of carrier confinement effect because the thickness of each well layer does not increase, and this is successful in raising the emission efficiency. In short, the emission intensity of the emission unit layer can be adjusted by the thickness and/or the number of layers of the well layers. In a pseudo-continuous spectrum to be obtained, a wavelength region having a larger emission intensity will be ascribable to a larger thickness and/or a larger number of layers of the correspondent well layers, and this allows simple procedures for designing the emission unit layer causing a desired pseudo-continuous spectrum. It is now preferable, as shown in FIG. 4, to keep the height of the barrier layers nearly constant so that carriers not contributable to the emission in one well layer are not prevented from migrating towards the other well layers. It is therefore preferable that the emission unit layer causative of a shorter emission wavelength (i.e., the emission unit layer having well layers of a wide band gap energy) has a shallower depth of the well.

Figure 14:
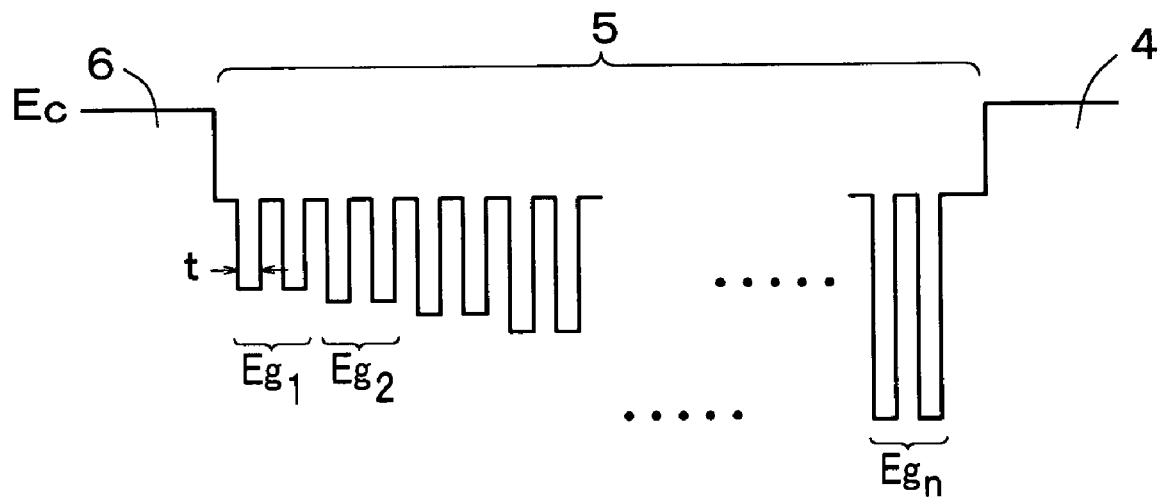
FIG. 14 is a band chart showing the bottom side of the conduction band in the second modified example of the active layer.
Figure 15:
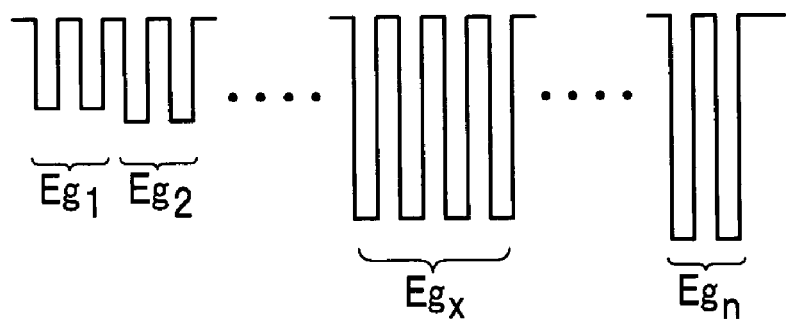
FIG. 15 is a band chart showing the bottom side of the conduction band in the third modified example of the active layer.

The number of the well layers within each emission unit layer may be uniform as shown in FIG. 14, or may vary according to the wavelength region of the emission unit layer as shown in FIG. 15. That is, design of the pseudo-continuous spectrum will further be facilitated by setting a larger number of the well layers contributable to a wavelength region having a larger emission intensity.

As shown in FIGS. 2 and 3, the double hetero light emitting layer portions 8, 18 of the first device 10 and second device 20 use the individual main surfaces on one side of the layer stacking direction, that are the first principal face PF of the first device 10 and second device 20, as the light extracting surface, and as shown in FIGS. 4 and 7, the emission unit layers (well layers W1, . . . , Wn) are aligned so that those causative of longer emission wavelength are disposed more further from the light extraction surface in the thickness-wise direction of the active layer. Emitted light having a shorter wavelength is more likely to be absorbed by a semiconductor having a band gap smaller than the energy of the emission wavelength. However in the above-described disposition in which an emission unit layer causative of a long emission wavelength is disposed far from the light extraction surface, any other emission unit layers stacked on the light extraction surface side have wider band gaps larger than the energy of light emitted from the underlying layer. This configuration is thus less causative of light absorption, and is successful in raising the light extraction efficiency.

Figure 16:
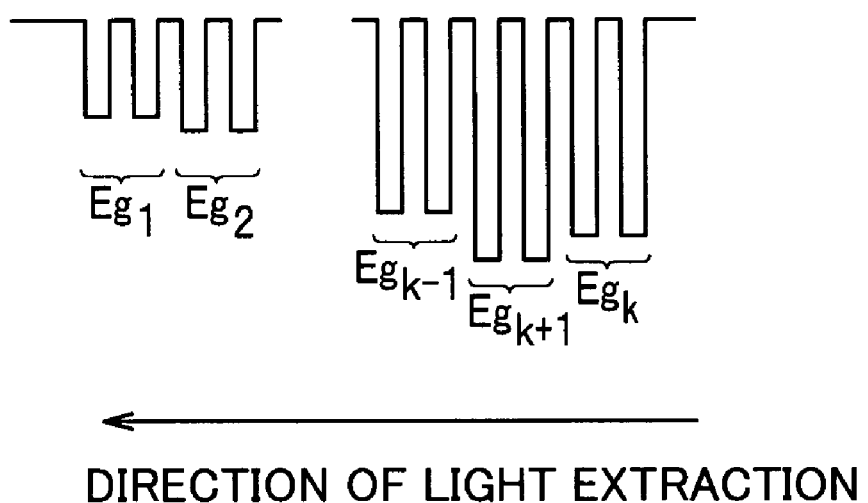
FIG. 16 is a band chart showing the bottom side of the conduction band in the fourth modified example of the active layer.

On the other hand, the order of disposition of the emission unit layers according to the band gap energy can partially be exchanged by intention, as shown in FIG. 16, so as to enhance or suppress emission intensity in a specific wavelength region, for the purpose of controlling color rendering properties described later. By exchanging the order of band gap energy, an emission unit layer situated closer to the light extraction surface (a layer having a band gap energy of $Eg_{k+1}$ in FIG. 16) has a relatively enhanced light extraction intensity, or absorbs light emitted from the underlying layer (a layer having a band gap energy of $Eg_k$ in FIG. 16) to thereby weaken the emission.

The emission efficiency can be raised based on carrier confinement effect, where the emission unit layers are preferably configured so as to have quantum well structure. It is necessary in this case to adjust thickness of the well layer equivalent to or shorter than the mean free path of electrons (generally 10 nm or less, typically 2 to 5 nm). Adoption of the quantum well structure is successful in stabilizing the emission wavelength and raising the emission efficiency. Thickness of the barrier layers thinned to as small as 10 nm or less (where, 5 nm or more is preferable in view of preventing carrier passage based on the tunneling effect) can allow mismatching of the lattice constants to as much as 2 to 3%, and can facilitate expansion of the emission wavelength range. Adoption of the quantum well structure is also advantageous in expanding the emission wavelength region towards the shorter regions, because the effect of localizing carriers within the wells can realize a direct-transition-like behavior even in the shorter wavelength regions where any bulk crystal can only achieve indirect transition.

Because the thickness of the well layer in the quantum well structure is restricted as described in the above, adjustment of the emission intensity based on the layer thickness is not expectable. The emission intensity of the emission unit layers having the quantum well structure is thus controlled by selecting the number of layers of the well layers. The emission unit layers thus have a multiple quantum well structure. In the multiple quantum well structure, formation of sub-bands can further enhance the carrier confinement effect, and this makes the structure more advantageous in increasing the emission efficiency. It is now preferable that an emission unit layer causing a shorter emission wavelength is designed to have a shorter thickness, because the mean free path of the carrier becomes shorter.

Figure 20:
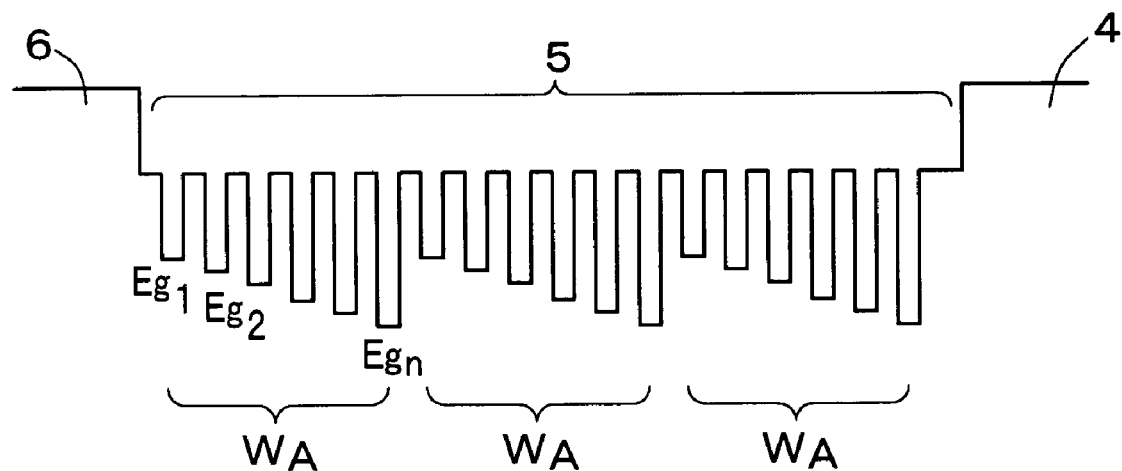
FIG. 20 is a band chart showing the bottom side of the conduction band in the fifth modified example of the active layer.

In one modified example of the emission unit layer, it is also allowable, as shown in FIG. 20, to assume a plurality of emission unit layers differing from each other in the emission wavelength as one repetitive unit $W_A$, and to form a plurality of such repetitive units $W_A$ in the thickness-wise direction of the active layer 5. This configuration is advantageous for the case where it is necessary to make the intensity distribution of the individual wavelength components flat as possible. In an exemplary case where the main surfaces of the double hetero light emitting layer portions 8, 18 on one side in the stacking direction are used as the light extraction surface, it is preferable, in terms of relieving influences of the light absorption, that the emission unit layer in the repetitive unit causative of longer emission wavelength is disposed more further from the light extraction surface in the thickness-wise direction of the active layers 5, 15.

Figure 21:
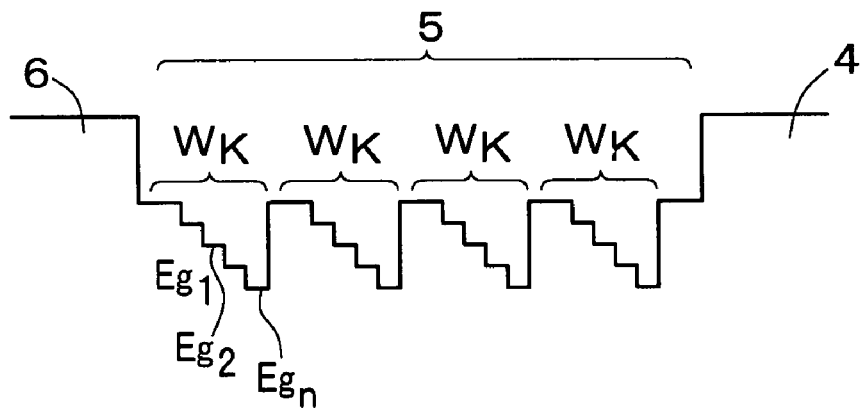
FIG. 21 is a band chart showing the bottom side of the conduction band in the sixth modified example of the active layer.

It is also allowable, as shown in FIG. 21, to adopt a band structure having a stepped bottom of each well $W_k$, which is obtainable by composing each well $W_k$ with a stack of a plurality of compound of semiconductor layers having different alloy compositions. This configuration is advantageous in simplifying the fabrication process since only a small number of barrier layers is necessary.

Figure 18:
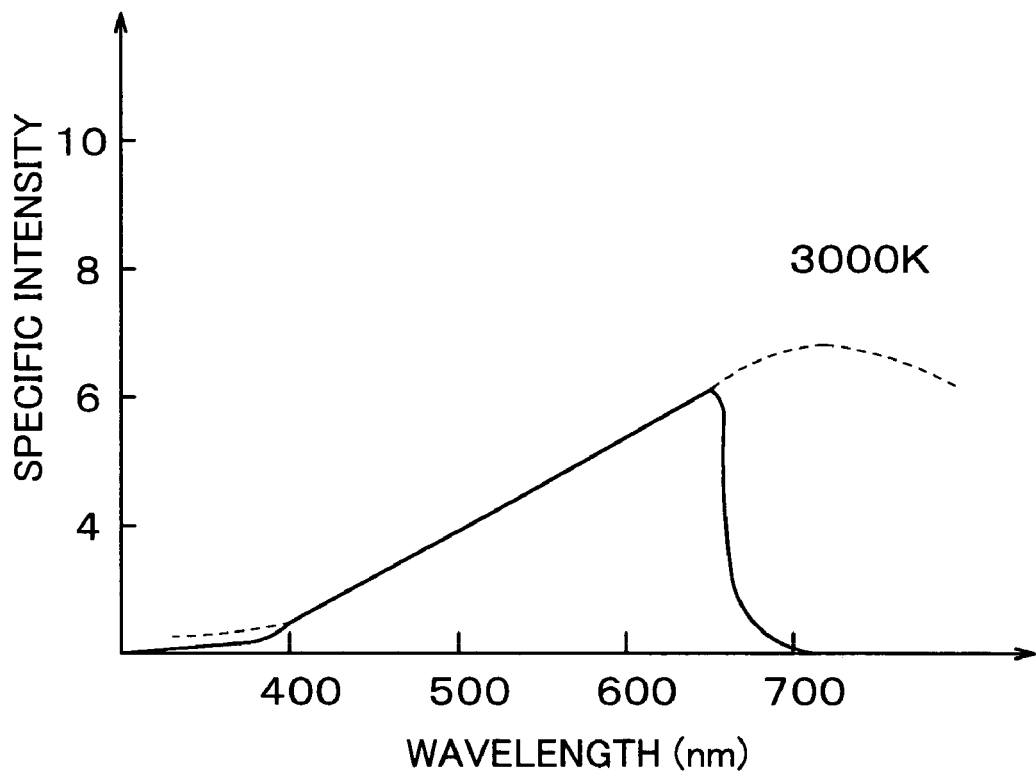
FIG. 18 is a graph showing a spectrum of an incandescent bulb in the visible region.

In this embodiment, the active layers 5, 15 of both devices 10, 20 are designed so that the pseudo-continuous spectrum to be obtained has a pseudo-bulb-light spectrum simulating a continuous spectrum of an incandescent bulb. FIG. 18 shows a spectral waveform of an incandescent bulb having a tungsten filament operated at a color temperature of approx. 3,000 K. As indicated by a broken line in the drawing, an intensity peak appears at around 800 nm in the near-infrared region, and the intensity distribution in the visible light region shows an increasing tendency with the emission wavelength. It can rapidly be understood that the emission is very likely to elevate the temperature of the light source since the spectrum contains a considerable intensity of infrared radiation.

In the invention, the spectrum shown in FIG. 18 is simulated by combining monochromatic lights (emission unit) of various wavelength emitted from a plurality of emission unit layers in a so-called digital manner, to thereby obtain the pseudo-continuous spectrum. Omission of the well layers causative of emission at a wavelength of 700 nm or longer from the first device 10 can give a spectrum, as indicated by a solid line in FIG. 18, in which infrared radiation components are reduced to a considerable degree. On the other hand, the continuous spectrum of the incandescent bulb also contains hazardous ultraviolet radiation at the short wavelength region although in a slight amount. It is now also possible to reduce the ultraviolet components by omitting well layers causative of emission at a wavelength of 360 nm or shorter from the second device 20, as described later.

Figure 5:
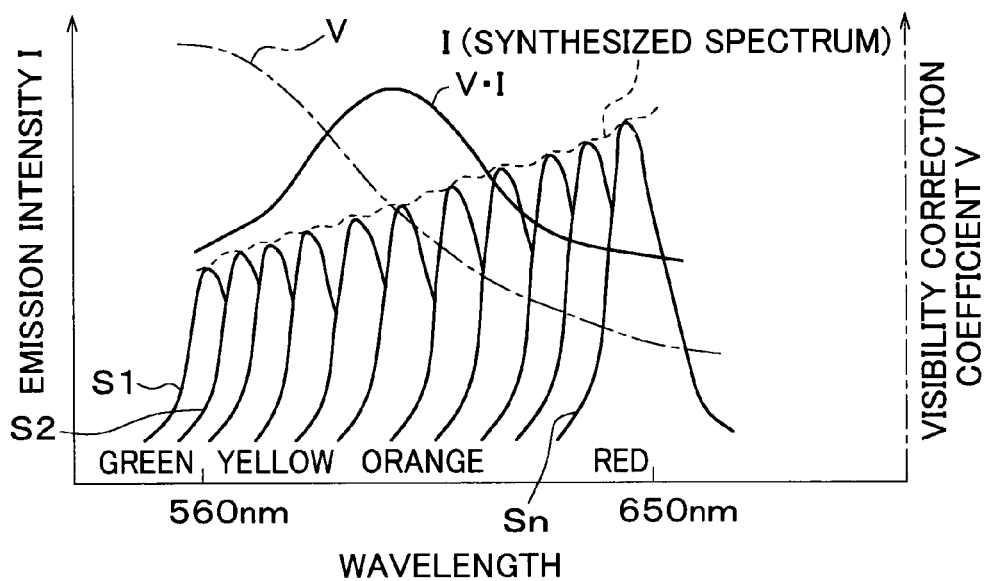
FIG. 5 is a conceptual drawing of a pseudo-continuous spectrum obtained by the first light emitting device.
Figure 8:
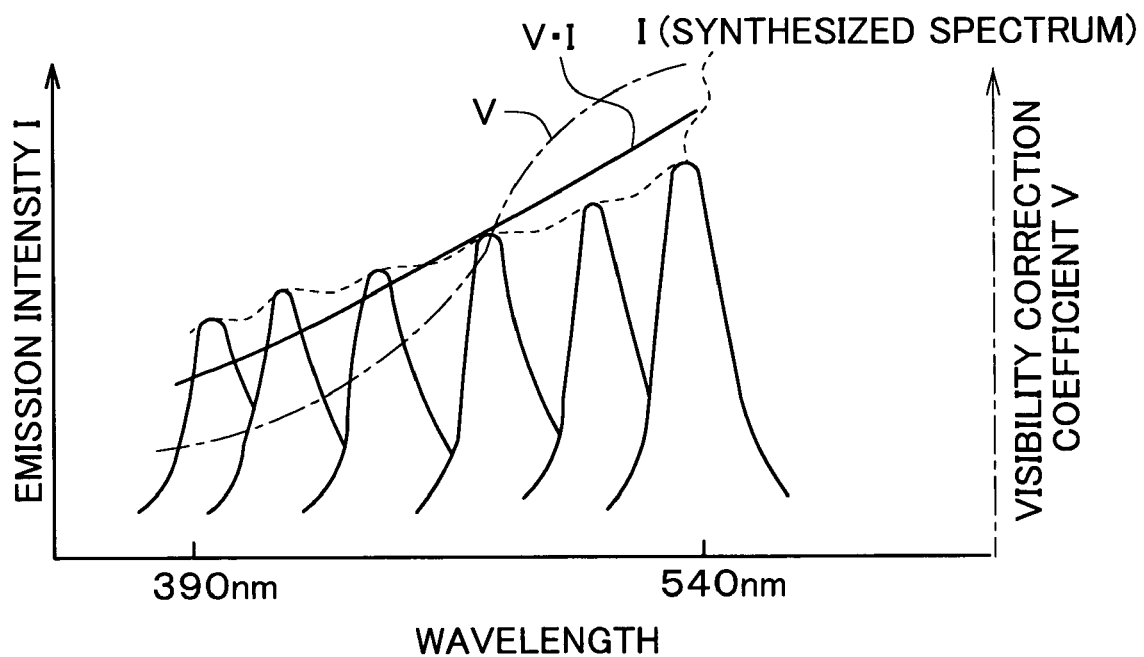
FIG. 8 is a conceptual drawing of a pseudo-continuous spectrum obtained by the second light emitting device.

In the embodiment, the active layers 5, 15 of the first and second devices 10, 20 are configured as described below. As shown in FIGS. 5 and 8, a plurality of the emission unit layers are adjusted so that those (well layers) causative of longer emission wavelength have larger emission intensity. More specifically, the emission unit layers causative of longer emission wavelength are provided in larger thickness of the well layers or larger number of layers. To closely simulate the spectral waveform shown in FIG. 18, a ratio ($I_{650}/I_{560}$) of intensity at 650 nm ($I_{650}$) and intensity at 560 nm ($I_{560}$) falls on 1.4 or around. Table 3 shows exemplary settings of band gap energy, thickness, and number of layers of the individual quantum well layers for the case where the quantum well layers having band gap energies varied at almost regulars intervals are formed in the first device 10 (alloy compositions can conveniently be determined referring to Table 1). Table 4 shows exemplary settings of band gap energy, thicknesses, and number of layers of the individual quantum well layers for the case where seven quantum well layers having band gap energies varied at almost regular intervals are formed in the second device 20.

TABLE 3

|   | Eg (eV) | Wavelength (nm) | Layer thickness (nm) | Number of layers |
|---|---------|-----------------|---------------------|------------------|
| 1 | 2.19 | 566 | 5 | 5 |
| 2 | 2.16 | 574 | 5 | 5 |
| 3 | 2.13 | 582 | 20 | 5 |
| 4 | 2.10 | 590 | 20 | 5 |
| 5 | 2.07 | 599 | 20 | 6 |
| 6 | 2.04 | 608 | 20 | 6 |
| 7 | 2.01 | 617 | 20 | 6 |
| 8 | 1.98 | 626 | 20 | 7 |
| 9 | 1.95 | 636 | 20 | 7 |
| 10 | 1.92 | 645 | 20 | 7 |
| 11 | 1.89 | 656 | 20 | 7 |

TABLE 4

|   | Eg (eV) | Wavelength (nm) | Layer thickness (nm) | Number of layers |
|---|---------|-----------------|---------------------|------------------|
| 1 | 3.17 | 391 | 3 | 3 |
| 2 | 3.01 | 412 | 3 | 3 |
| 3 | 2.85 | 435 | 3 | 3 |
| 4 | 2.66 | 466 | 3 | 4 |
| 5 | 2.50 | 496 | 3 | 4 |
| 6 | 2.34 | 530 | 3 | 4 |
| 7 | 2.22 | 559 | 3 | 5 |

As shown in FIGS. 5 and 8, although each of the emission unit layers shows an emission spectrum (referred to as unit spectrum, hereinafter) having a narrow distribution around a specific peak wavelength, these are synthesized to thereby produce pseudo-continuous spectra having waveforms indicated by the broken lines in the drawings, which are obtained by connecting the peak positions of the individual unit spectra, and are output from the devices 10, 20. A larger number of the well layers in the individual emission unit layer ensures a more faithful reproduction of the spectral waveform (in the visible light region) of the heat-radiation-type light source to be modeled. However for the case where a fewer number of layers is desired, it is also allowable to adjust the thickness as a subsidiary means for fine adjustment. It is still also allowable that not all of the well layers in the emission unit layer are quantum well layers, and that a part of the well layers may be composed as thick non-quantum-well layers.

Figure 6:
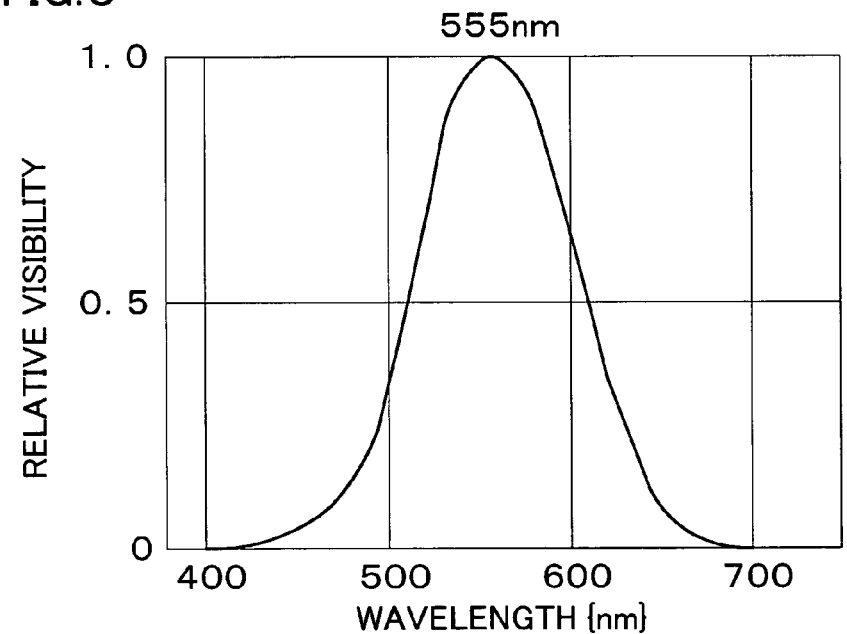
FIG. 6 is a graph showing a wavelength dependence of the relative visibility in the visible region.

Both devices 10, 20 show emission spectra in which the emission intensities increase as the wavelength becomes longer. Relative visibility of the visible light in relation to wavelength, however, becomes maximum at 555 nm or around in bright places as shown in FIG. 6. In FIGS. 5 and 8, curves for expressing wavelength dependence of visibility correction coefficient V are shown by dashed lines. Visibility correction intensity V·I can be given by a product of absolute intensity I and visibility correction coefficient V. As shown in FIG. 5, the first device 10 gives a peak of visibility correction intensity V·I at the intermediate wavelength region, or more specifically yellow to orange region, because wavelength dependences of the absolute intensity I and visibility correction coefficient V follow inverted tendencies. In contrast to this, as shown in FIG. 8, visibility correction intensity V·I of the second device 20 monotonously increases as wavelength increases, because wavelength dependences of the absolute intensity I and visibility correction coefficient V follow the same tendencies.

Figure 9:
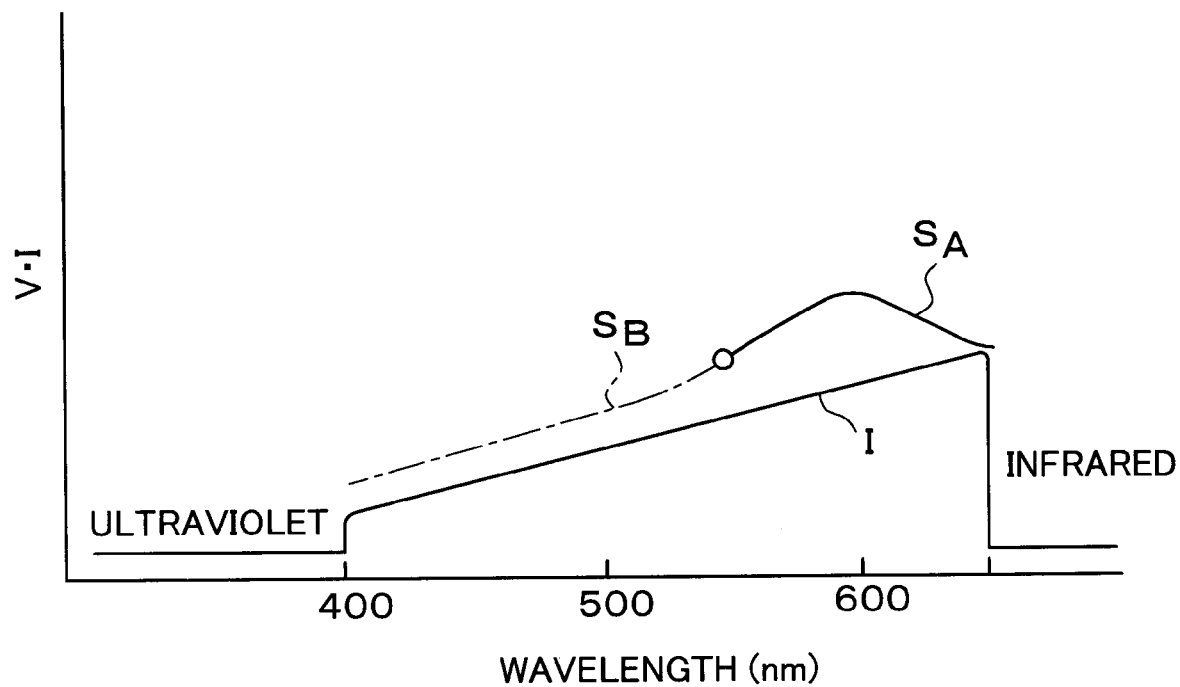
FIG. 9 is a conceptual drawing of a synthesized spectrum obtained from the first light emitting device and second light emitting device.

The illumination light source 50 outputs a synthetic result of the spectrum of the first device 10 covering the longer wavelength region and the spectrum of the second device 20 covering the shorter wavelength region. As a consequence, a finally obtainable form of the pseudo-bulb-light spectrum is such as being shown in FIG. 9, in which a spectral waveform SB ascribable to the second device 20 is linked to the end on the lower wavelength side of a spectral waveform SA ascribable to the first device 10. In other words, the absolute intensity I of the pseudo-bulb-light spectrum, that is, the emission intensity distribution after being corrected in the visibility, is expressed as having an intensity peak ranging from 570 nm to 640 nm, showing a yellowish to orangish, warm and soft illumination color closely resemble to that of incandescent bulbs.

Figure 17:
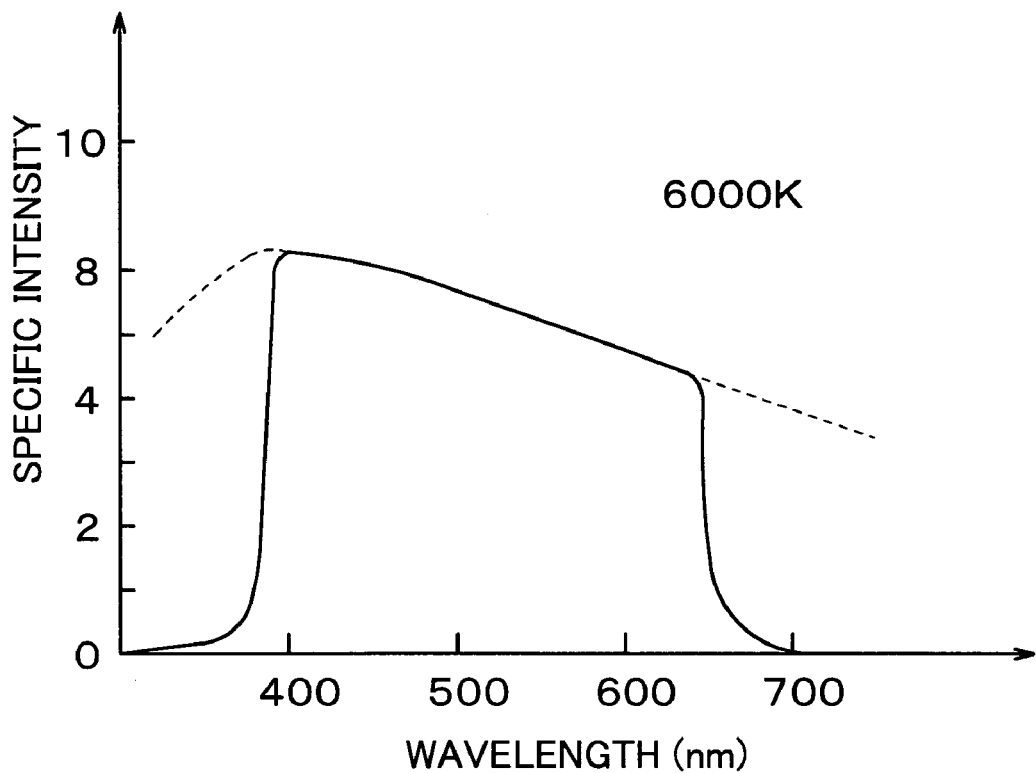
FIG. 17 is a graph showing a solar spectrum in the visible region.

The final emission spectral form can be obtained in an arbitrarily form by controlling the emission intensity of the emission unit layers covering the individual wavelength regions based on the number of layers or thickness of layers. In particular for the case where an illumination light having color rendering properties close to those of the natural light is desired, it is preferable to synthesize a pseudo-solar spectrum simulating the continuous solar spectrum, as the pseudo-continuous spectrum. FIG. 17 shows a solar spectrum in the visible light region, where an intensity peak appears in the shorter wavelength region at around 400 nm because the color temperature is as high as approx. 6,000 K. It is also found that almost over the entire portion of the visible light, the absolute intensity I tends to decrease as the wavelength becomes longer. In real contrast to those shown in FIGS. 5 and 8, it is desirable that a plurality of the emission unit layers are adjusted so that the layers causative of shorter emission wavelengths will have higher emission intensities. Exemplary set values for the number of the individual well layers of the first device 10 and second device 20 are shown in Table 5 and Table 6, respectively.

TABLE 5

|   | Eg (eV) | Wavelength (nm) | Layer thickness (nm) | Number of layers |
|---|---------|-----------------|---------------------|------------------|
| 1 | 2.19 | 566 | 5 | 6 |
| 2 | 2.16 | 574 | 5 | 6 |
| 3 | 2.13 | 582 | 20 | 6 |
| 4 | 2.10 | 590 | 20 | 6 |
| 5 | 2.07 | 599 | 20 | 6 |
| 6 | 2.04 | 608 | 20 | 5 |
| 7 | 2.01 | 617 | 20 | 5 |
| 8 | 1.98 | 626 | 20 | 5 |
| 9 | 1.95 | 636 | 20 | 5 |
| 10 | 1.92 | 645 | 20 | 5 |
| 11 | 1.89 | 656 | 20 | 5 |

TABLE 6

|   | Eg (eV) | Wavelength (nm) | Layer thickness (nm) | Number of layers |
|---|---------|-----------------|----------------------|------------------|
| 1 | 3.17    | 391             | 3                    | 7                |
| 2 | 3.01    | 412             | 3                    | 7                |
| 3 | 2.85    | 435             | 3                    | 7                |
| 4 | 2.66    | 466             | 3                    | 7                |
| 5 | 2.50    | 496             | 3                    | 7                |
| 6 | 2.34    | 530             | 3                    | 6                |
| 7 | 2.22    | 559             | 3                    | 6                |

Figure 19:
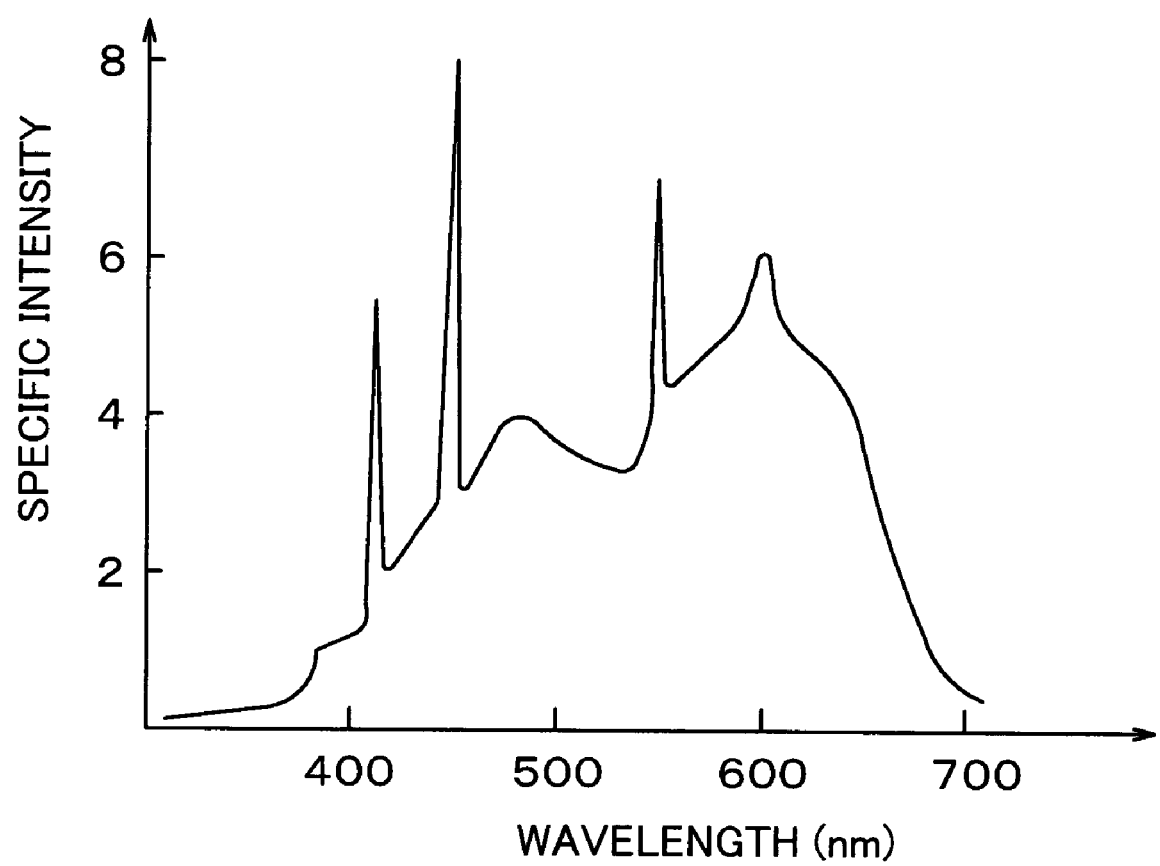
FIG. 19 is a graph showing a spectrum of a fluorescent lamp.

In the field of lighting, how faithfully and how inexpensively the color rendering properties of the natural light can be reproduced has long been persisting as one extreme proposition. For example, fluorescent lamps which is extensively disseminated seem to be white but spectrum thereof is far different from that of the natural light (sunlight) and has some problems in color rendering properties. FIG. 19 shows an exemplary spectrum of a high-color-rendering-type fluorescent lamp. It is found that the spectral waveform in the background portion largely differs from that of the solar spectrum shown in FIG. 17. It is therefore a matter of necessity to combine emission materials corresponded to three narrow wavelength regions of red, green and blue (RGB), but the resultant spectrum is such as having three sharp peaks in a form of bright lines ascribable to the individual fluorescent materials. As is presumed from the difference in the waveform as compared with FIG. 17, it is obvious that there is an unrecoverable gap between the artificial light and the natural light. However according to the invention, the visible light portion in the solar spectrum shown in FIG. 17 can faithfully be reproduced as a pseudo-solar spectrum by combining various wavelengths emitted from the emission unit layers typically according to the combinations listed in Table 5 or 6. For example, it is easy to achieve 85 or above in an average color rendering index specified by JIS:Z8726 (1990), and it is also relatively easy to raise an average color rendering index up to a level equivalent to or higher (95 to 100) than a value of 90 to 95, which is generally considered as an upper limit in the field of fluorescent lamps. It is even possible to synthesize the waveform of the fluorescent lamp shown in FIG. 19 by using the light emitting devices of the invention.

Figure 33:
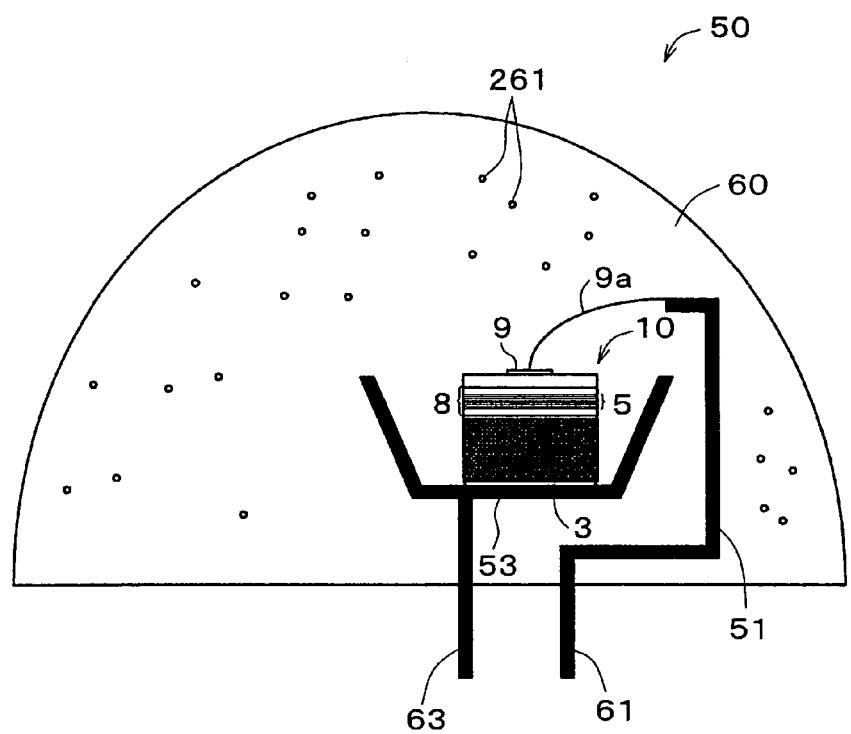
FIG. 33 is a schematic drawing showing an exemplary light source module configured using a single light emitting device.
Figure 34:
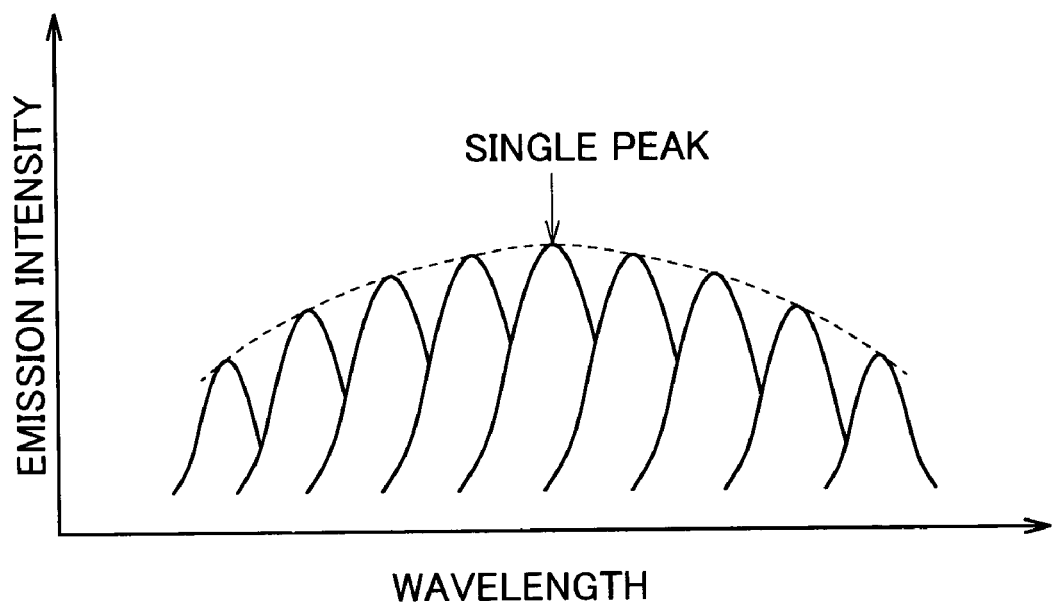
FIG. 34 is a graph showing an exemplary pseudo-continuous spectrum having a single broad peak in the effective wavelength region.
Figure 35:
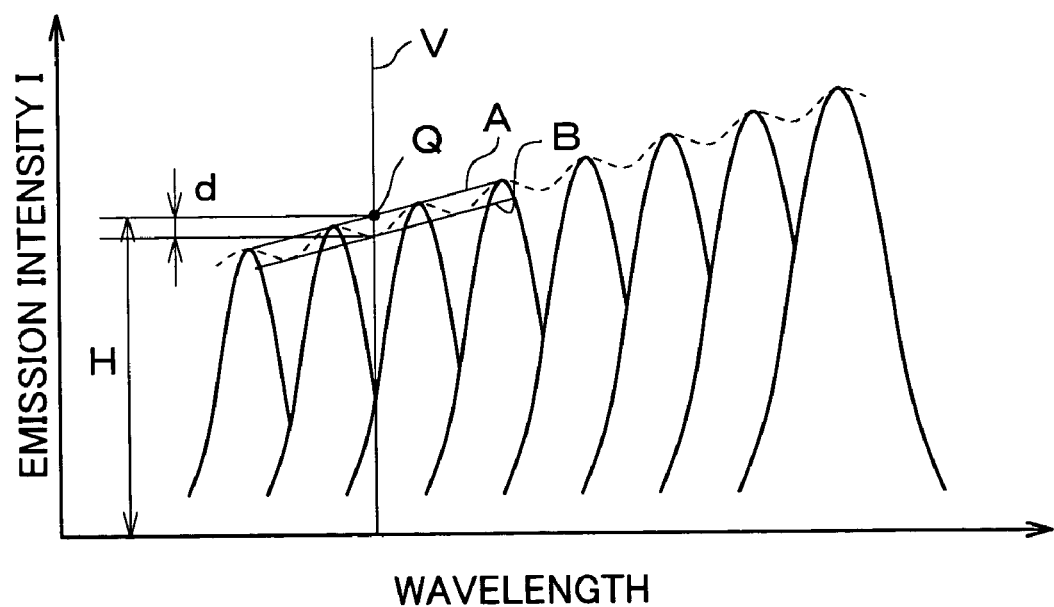
FIG. 35 is a graph for explaining a definition of ripple ratio in the pseudo-continuous spectrum.

While embodiments for faithfully reproducing spectral waveforms of heat-radiation-type light sources have been described in the above, the invention is by no means limited thereto. For example, if the visible light in the blue wavelength region is excluded from an emission spectrum of a incandescent bulb, the residual wavelength region is still enough to simulatively realize an illumination color specific to the incandescent bulb, in which yellow to orange color is prevailing. In this case, the light source module 50 can be composed only by the first device 10, as shown in FIG. 33. A pseudo-continuous spectrum obtainable from this module is typically such as that shown in FIG. 5, where an effective wavelength region is approx. 90 nm. On the other hand, an illumination light from which red wavelength region is excluded can successfully be obtained by composing the module only with the second device 20.

Figure 32:
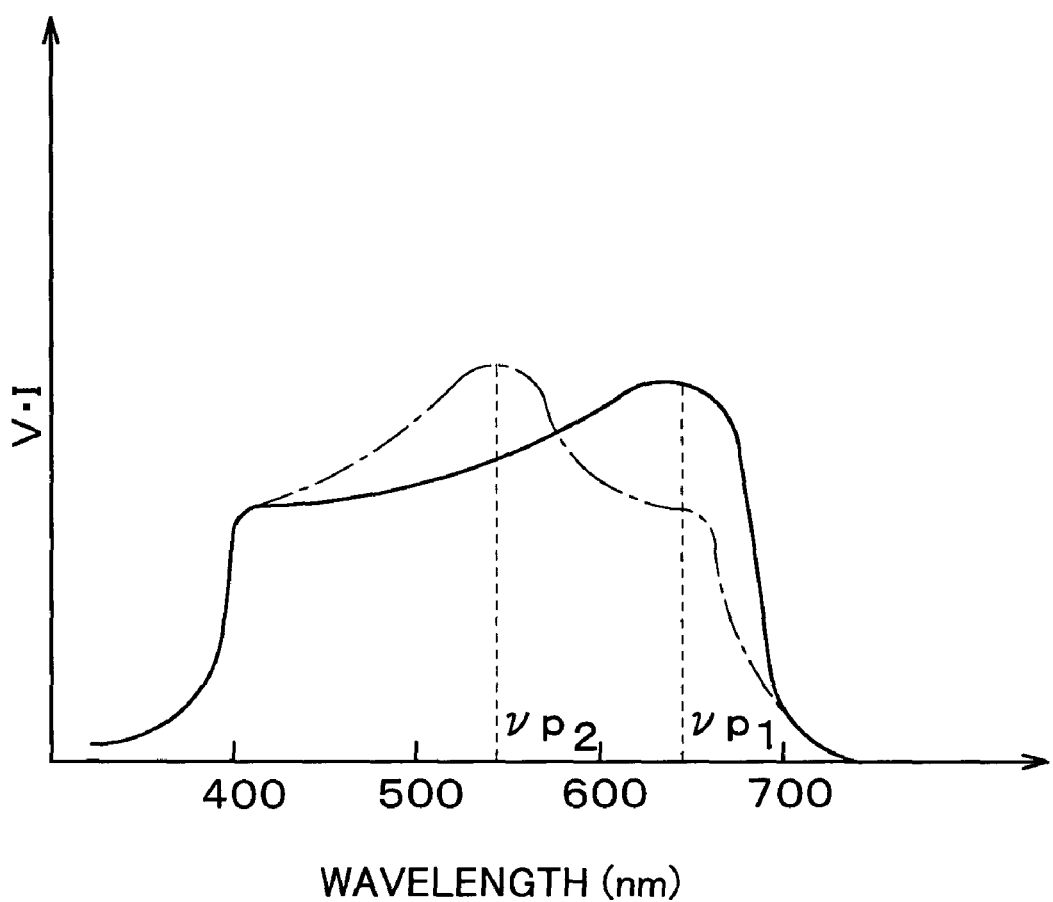
FIG. 32 is a graph showing an exemplary pseudo-continuous spectrum having a color rendering wavelength region realized by the light emitting device of the invention.

It is also relatively easy in the invention to intentionally alter the intensity distribution in a selective wavelength for the purpose of enhancing color rendering properties for a specific color tone, by adjusting the emission intensity of emission unit layers corresponded to such wavelength region. More specifically, the intensity distribution of the pseudo-continuous spectrum is designed so that a predetermined wavelength region in the effective wavelength region of the pseudo-continuous spectrum will have a color rendering property for a color tone corresponded to the wavelength region selectively enhanced than color rendering properties for other color tones corresponded to other wavelength regions. Illumination using thus-designed light source can make a portion of an illuminated object having the color tone defined as a target for the color rendering stand out clearly. FIG. 32 shows exemplary pseudo-continuous spectra having such color rendering wavelength regions. A spectrum indicated by a solid line has an intensity peak at around 650 nm in the red region, and is suitable for enhancing color rendering properties for red tones (e.g., color of meat). On the other hand, another spectrum indicated by dashed line has an intensity peak at around 550 nm in the green region, and is suitable for enhancing color rendering properties for green tones. In particular, lighting-up of parks or gardens with this light can successfully render green color of plants.

The above-described color rendering wavelength region can be created by setting emission intensity of the emission unit layers contributable to the target color rendering wavelength region larger than emission intensity of other emission unit layers contributable to other color rendering wavelength regions. FIG. 15 shows an exemplary case where the number of layers of the emission unit layers (Egx) contributable to the color rendering wavelength region is selectively increased from the number of layers of other emission unit layers.

Figure 23:
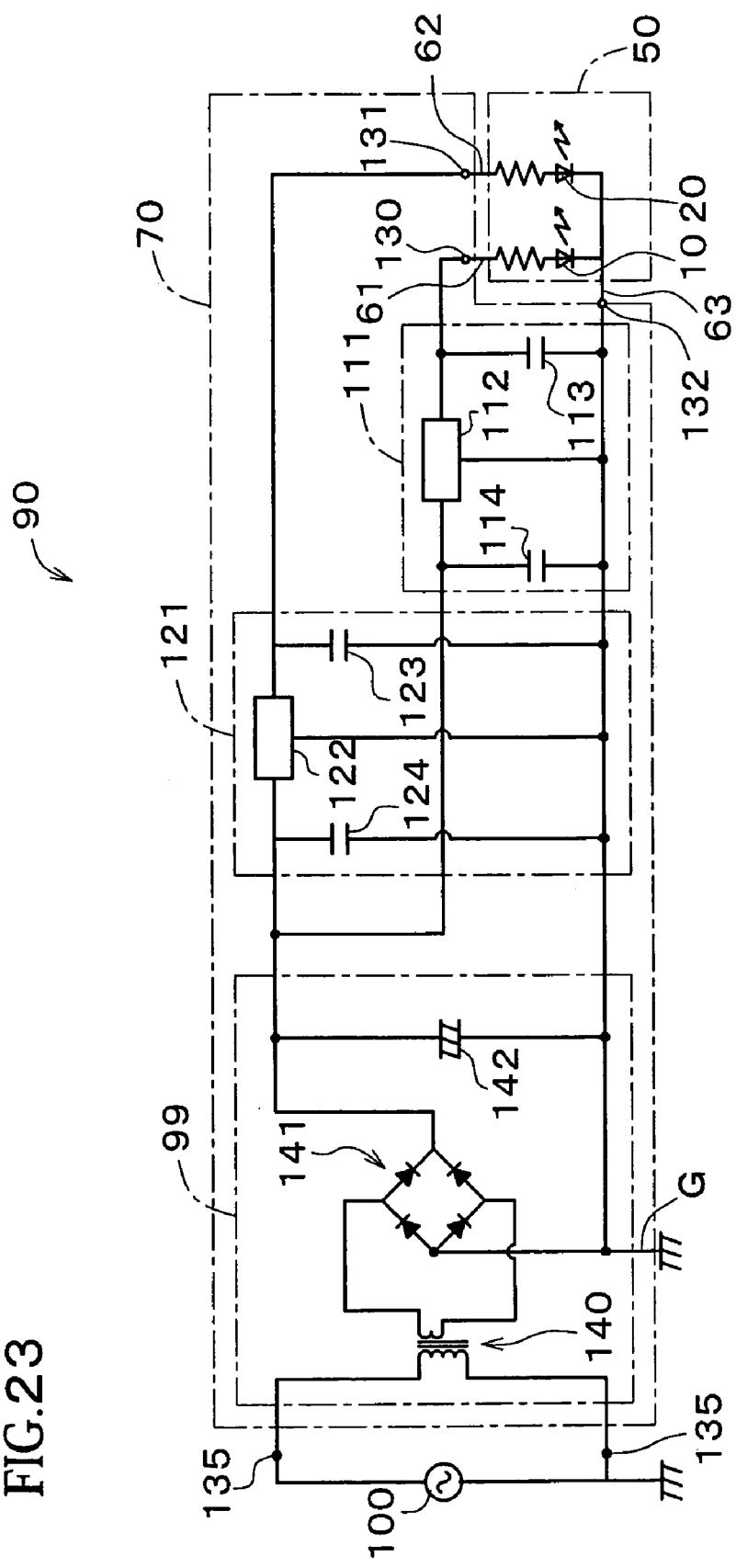
FIG. 23 is a circuit diagram showing the first exemplary circuit configuration of the lighting apparatus of the invention.

The following paragraphs will describe embodiments of lighting apparatuses using the above-described light source module 50. FIG. 23 shows a circuit diagram of a lighting apparatus 90 according to one embodiment of the invention. The lighting apparatus 90 comprises the light emitting devices 10, 20 (light source module 50) and a power supply portion 70 for supplying emission drive power to the light emitting devices 10, 20, and is configured so as to extract visible light from the light emitting devices 10, 20 as an illumination light. The power supply portion 70 has a voltage conversion portions (including power source circuits 111, 121 or AC/DC converter 99) for converting output voltage from a power source portion 100 into light emitting device drive voltage. In this embodiment, the first device 10 is an AlGaInP-base light emitting device, and has a drive voltage of approx. 2 V, an operation current value of approx. 100 mA to 1 A, and a power consumption of approx. 0.3 to 3 W. Available external power sources include a commercial AC power source (e.g., AC 100 V), dry cell (e.g., DC 1.5 V) and car battery (DC 9 to 15 V), and output voltage of any of these power sources is used after converted by a power source circuit (voltage conversion portion) into light emitting device drive voltage.

Figure 22:
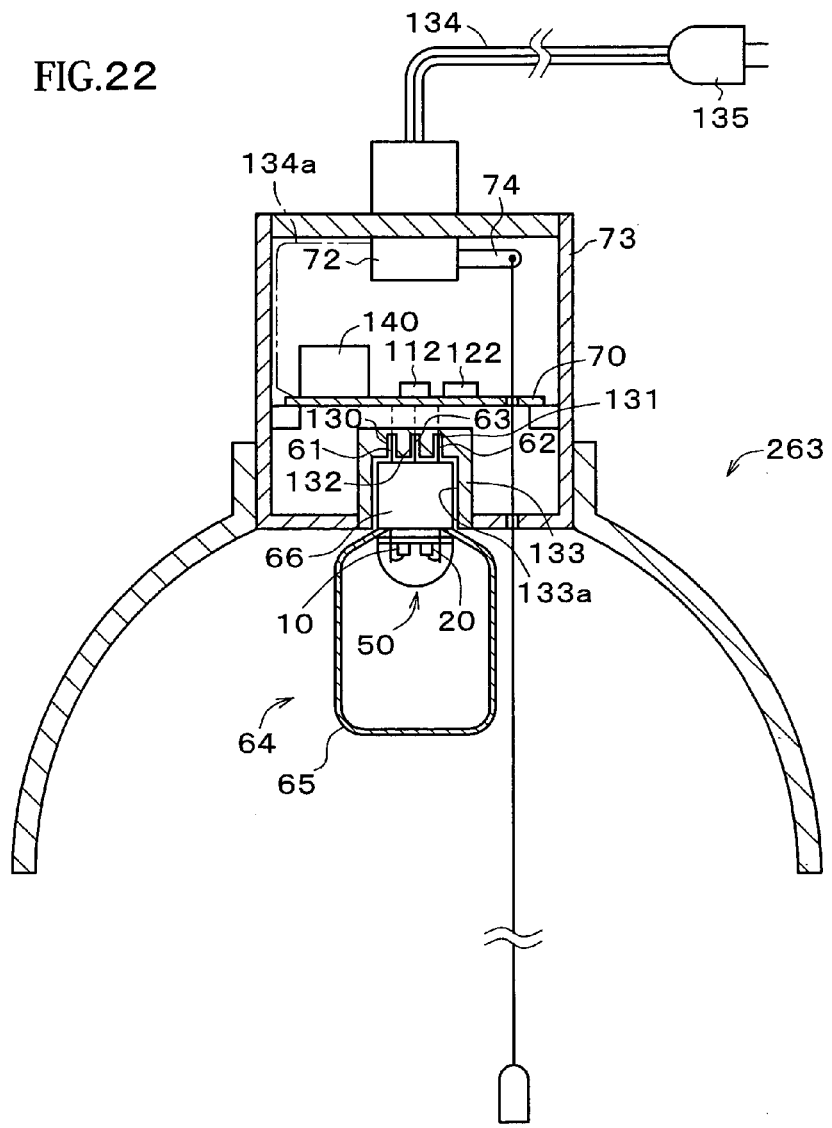
FIG. 22 is a schematic sectional view showing the first embodiment of a lighting apparatus of the invention.

Although the light source module 50 using semiconductor devices has a service life far longer than that of incandescent bulbs or the like, long-term use also results in lowering of the emission intensity and the service life comes to the end. It is therefore convenient to configure the module so as to allow exchange of the exhausted light source. As shown in FIG. 23, the voltage conversion portions 99, 111, 121 are provided with drive voltage output terminals 130, 131, 132 for outputting light emitting device drive voltage. It is also convenient, as shown in FIG. 22, that the light source module 50 is configured so as to integrate the light emitting devices 10, 20 with incoming terminals 61, 62, 63, and so as to be connected to the drive voltage output terminals 130, 131, 132 through the incoming terminals 61, 62, 63 in a detachable manner. This configuration facilitates exchange operation of the exhausted light source module 50 simply by detaching such module, and by attaching a new light source module 50 to the drive voltage output terminals 130, 131, 132 through the incoming terminals (anode terminals 61, 62 and cathode terminal 63).

In the light source module 50 shown in FIG. 1, the second electrodes 3, 13 of both devices 10, 20 are connected to a cathode stage 53 as being mediated by a metal conductor paste such as an Ag paste. The first electrode 9, 19 of both devices 10, 20 are connected to conductor metal fittings 51, 52 through metal leads 9*a*, 19*a*. The second electrodes 3, 13 on the cathode side are commonly wired by the cathode stage 53, from which a cathode incoming terminal 63, which serves as one incoming terminal, is taken out. On the other hand, from the conductor metal fittings 51, 52, anode incoming terminals 61, 62, which serve as residual incoming terminals, are respectively taken out. The light source module 50 is configured so that the entire portions of the cathode stage 53, devices 10, 20 and conductor metal fittings 51, 52 are covered with a translucent resin mold 60 while allowing the incoming terminals 61, 62, 63 to project therefrom. The resin mold 60 may be composed of a thermoplastic resin such as acrylic resin and so forth, where it is preferable to distribute therein light scattering particles 261 which are composed of air bubble, glass or ceramic for the purpose of thoroughly mixing emitted light from both devices 10, 20.

Figure 10:
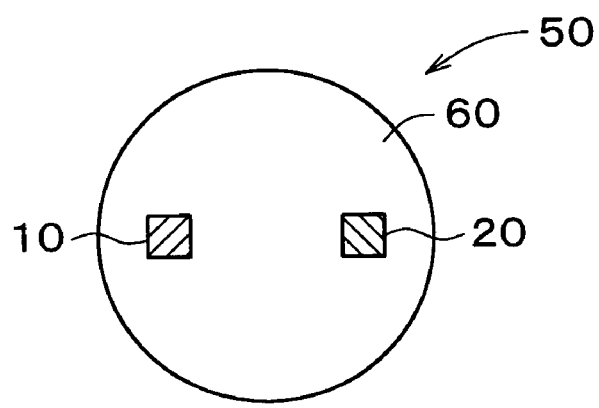
FIG. 10 is a plan view showing the first exemplary layout of the first light emitting device and second light emitting device in a light source module.
Figure 11:
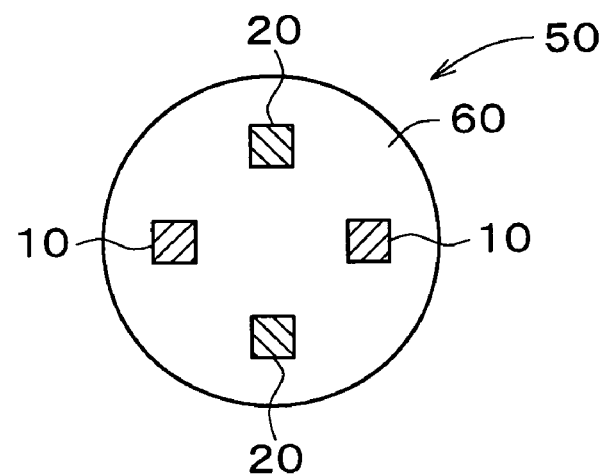
FIG. 11 is a plan view showing the second exemplary layout of the same.
Figure 12:
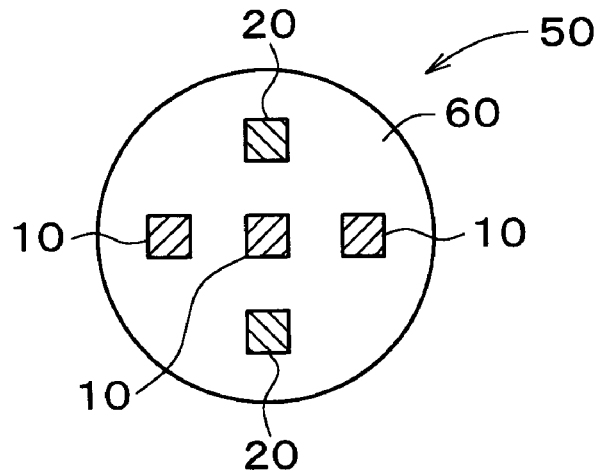
FIG. 12 is a plan view showing a third exemplary layout of the same.

The number of the first device 10 and the second device 20 to be incorporated into the light source module 50 may be one each as shown in FIG. 10, or in plural numbers as shown in FIGS. 11 and 12. FIG. 11 shows an exemplary configuration in which both devices 10, 20 are provided in the same numbers in order to improve the emission intensity, where the devices 10, 20 are alternately disposed along a certain route (circumferential direction, herein) so that the lights from both devices 10, 20, differing in emission wavelength regions, can be output after being thoroughly mixed. On the other hand, FIG. 12 shows an exemplary configuration in which both devices 10, 20 are provided in different numbers for purposes of adjusting spectral waveform to be synthesized, and of matching the emission levels of both devices 10, 20.

The circuit shown in FIG. 23 uses a commercial AC power source 100 as the power supply portion, and the voltage conversion portion is configured so as to have an AC/DC converter 99 for converting output voltage of the commercial AC power source into DC voltage. This configuration allows simple use of the lighting apparatus 90 by connecting it to an existing electric lamp line for supplying commercial AC. The AC/DC converter 99 can be connected to the commercial AC power source 100 through a power source terminal 135 typically composed of a receptacle plug or the like. In the embodiment shown in FIG. 23, the AC/DC converter 99 comprises a transformer 140 for stepping the power source voltage of the commercial AC power source 100 (e.g., 100 V) down to a predetermined voltage (e.g., 5 to 15 V), and a rectifier portion 141 for rectifying the stepped-down AC. The rectifier portion 141 herein uses a diode bridge so as to allow full-wave rectification.

The current rectified by the rectifier portion 141 is then smoothened in the waveform thereof by a capacitor 142, and is then input as being divided into the drive stabilization power source circuits 111, 121. The drive stabilization power source circuits 111, 121 individually comprise regulator IC's 112, 122 (capacitors 113, 114, 123, 124 are provided for preventing oscillation), and are configured so as to convert input voltage from the AC/DC converter 99 into DC drive voltage suitable for both devices 10, 20, and to output the DC voltage to the drive voltage output terminals 130, 131 on the anode side. The cathode terminal 63 provided commonly for the devices 10, 20 is connected to a grounding conductor G through the drive voltage output terminal 132 on the ground side.

FIG. 22 shows an exemplary configuration of an electric lamp 263 as one embodiment of the lighting apparatus 90 based on the circuit configuration shown in FIG. 23. In this case, the light source module 50 is assembled with a terminal case 66 and light bulb 65 to thereby form a light source unit 64 having a form of light bulb. From an end surface of the terminal case 66, the pin-formed incoming terminals 61, 62, 63 are projected. The terminal case 66 is integrated with a translucent lamp bulb 65 covering the light source module 50. The lamp bulb 65 can be composed of glass or a thermoplastic resin such as acrylic resin, where inclusion by dispersion of light-scattering particles composed of air bubble, glass or ceramic, or provision of roughened surface just like a ground glass on the inner surface thereof is successful in enhancing the light scattering effect and the mixing effect of the light emitted from the individual devices 10, 20.

The electric lamp 263 has a main case 73, and a light source socket 133 having an attachment recess 133*a* is provided to the main case 73. The light source unit 64 is attached so as to insert the terminal case 66 thereof into the attachment recess 133*a* of the light source socket 133, and so as to insert the incoming terminals 61, 62, 63 into the drive voltage output terminals 130, 131, 132 having a female connector form and disposed at the bottom of the attachment recess 133*a*. The drive voltage output terminals 130, 131, 132 are connected to a substrate of the power supply portion 70, from which a power supply line 134*a* is drawn out via a publicly-known switch box 72 so as to be connected to a power cord 134 having a power plug 135 on the end portion thereof. By plugging the power plug 135 into a commercial AC receptacle, AC is supplied through the power supply portion 70 to the light source module 50 of the light source unit 64, and this allows the electric lamp 263 to emit illumination light having a desired spectrum. Use of an operating portion 74 for operating the switch box 72 can effect ON/OFF of the power supply to the light source module 50, and can facilitate turning-on/turning-off of the electric lamp 263.

Figure 24:
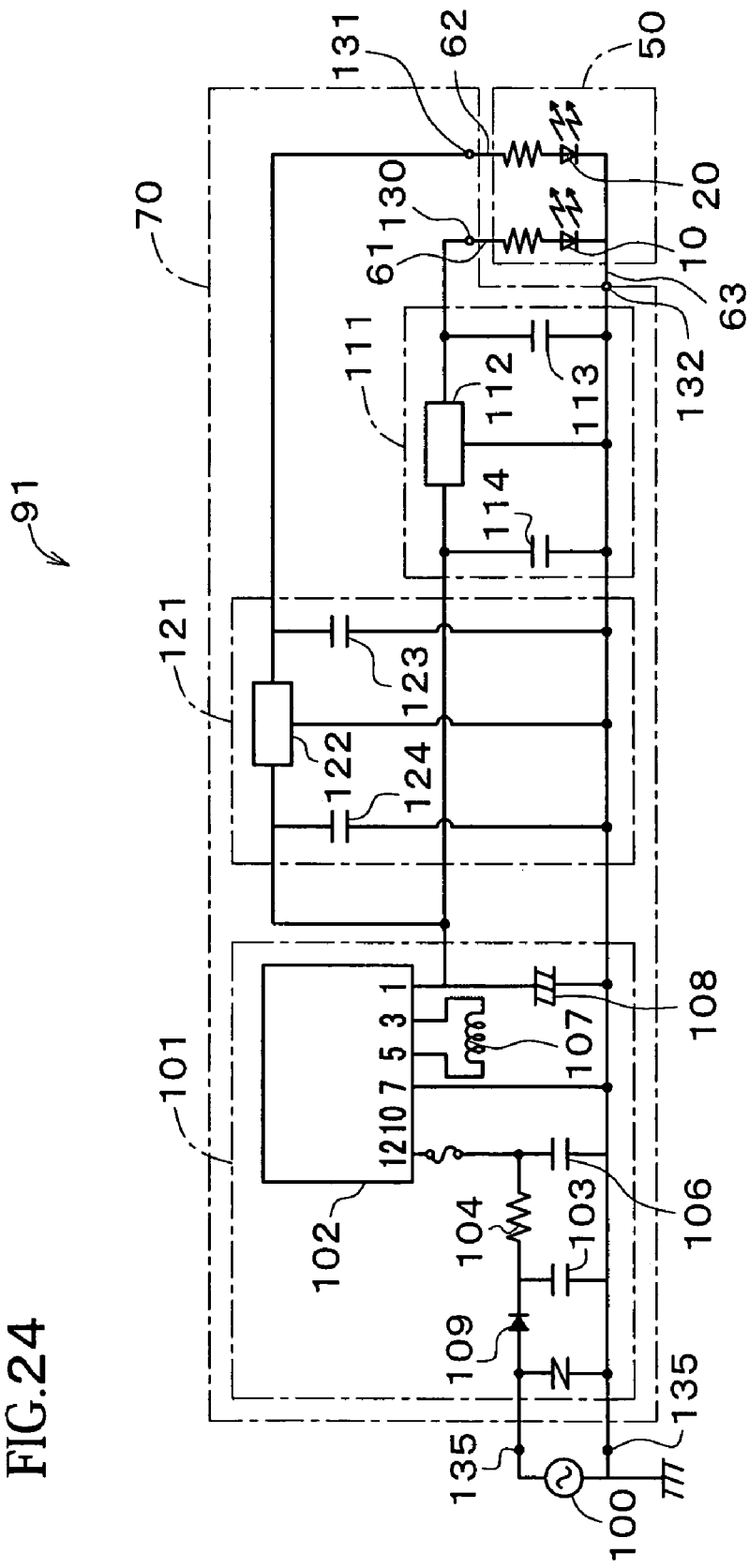
FIG. 24 is a circuit diagram showing the second exemplary circuit configuration of the lighting apparatus of the invention.

Meanwhile, the electric lamp 263 shown in FIG. 22 is configured as a device dedicated for use with a light source module using light emitting device. The light source module used herein is not applicable to the existing lighting apparatuses for use with incandescent bulbs. In this situation, there is an idea that the light source module can be made compatible with the existing light bulb socket and can more widely be used, if the voltage conversion portion is configured as being attachable to a light bulb socket directly connected to the commercial AC power source, through an attachment conductor portion compatible with the light bulb socket in a detachable manner. To make it possible to directly connect the voltage conversion portion to the bulb socket, the voltage conversion portion must be minimized as possible. In an exemplary constitution of a circuit 91 shown in FIG. 24, weight reduction is achieved by composing an AC/DC converter 101 using a dedicated LSI 102 (e.g., BP5057-15, product of Rohm Co., Ltd, JAPAN), rather than a transformer. The LSI 102 is configured as a step-down circuit which comprises a peripheral diode 109, capacitors 103, 106, 108, a resistor 104 and a coil 107. The circuit configuration of other portions will not be detailed here because it is fully identical with that shown in FIG. 23.

Figure 25:
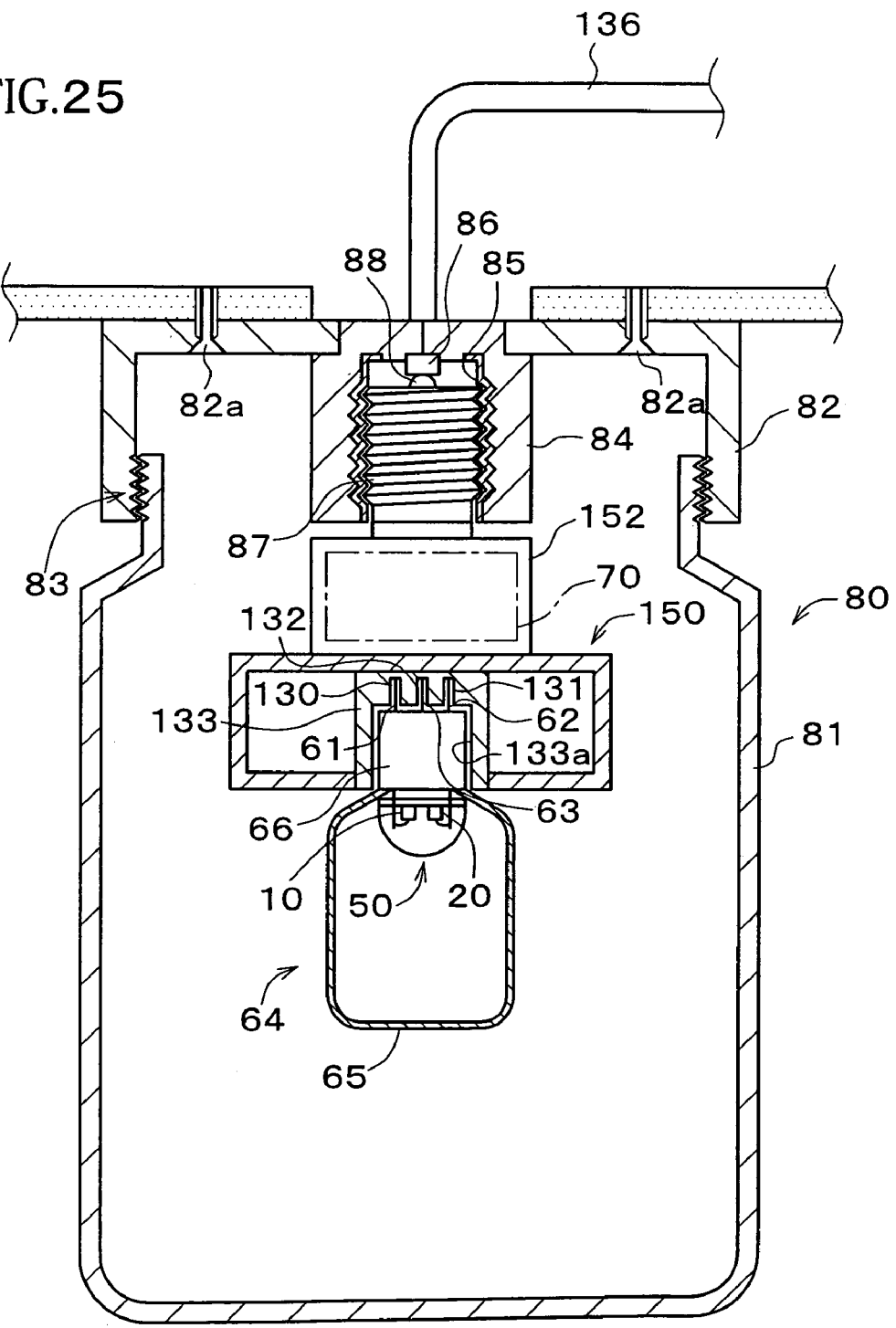
FIG. 25 is a schematic sectional view showing the second embodiment of a lighting apparatus of the invention.

FIG. 25 shows a specific embodiment of a electric lamp 80. In this configuration, a conversion adapter 150 having the power supply portion 70 is configured as being attachable to a light bulb socket 84 directly connected to the commercial AC power source, through an attachment conductor portion 87 compatible with the light bulb socket 84 in a detachable manner. The light bulb socket 84, together with a base plate 82 thereof, is attached to a target site such as ceiling or wall using tightening members 82a such as screws. A female-screw-type socket metal fitting 85 and a bottom terminal metal fitting 86 of a socket side disposed as being insulated therefrom are disposed on the inner surface of the light bulb socket 84, so as to receive AC from the commercial AC power source through a power supply line 136. The conversion adapter 150 has a case 152 enclosing the power supply portion 70, and a male-screw-type attachment conductor portion 87 having the same shape with the bulb base and a bottom terminal metal fitting 88 of the adapter side, which are to be connected to two AC input portions (one of which is for grounding), respectively, are disposed as being projected out from the case 152. The case 152 is provided with a light bulb socket 133 having an almost same structure as that shown in FIG. 22 (where common portions are given with the same reference numerals, and detailed description are omitted). When the conversion adapter 150 is attached to the light bulb socket 84 through the attachment conductor portion 87, conduction is established between the attachment conductor portion 87 and socket metal fitting 85, and between the bottom metal fitting 88 on the adapter side and the bottom metal fitting 86 on the socket side, and this allows the power supply portion 70 to receive commercial AC through the power supply line 136. Attachment of the light source unit 64 to the light bulb socket 133 of the conversion adapter 150 can turn on the electric lamp 80. A transparent hood 81 covering the light source unit 64 is attached to the base plate 82 in a detachable manner through a screw-type attachment/detachment portion 83.

Figure 26:
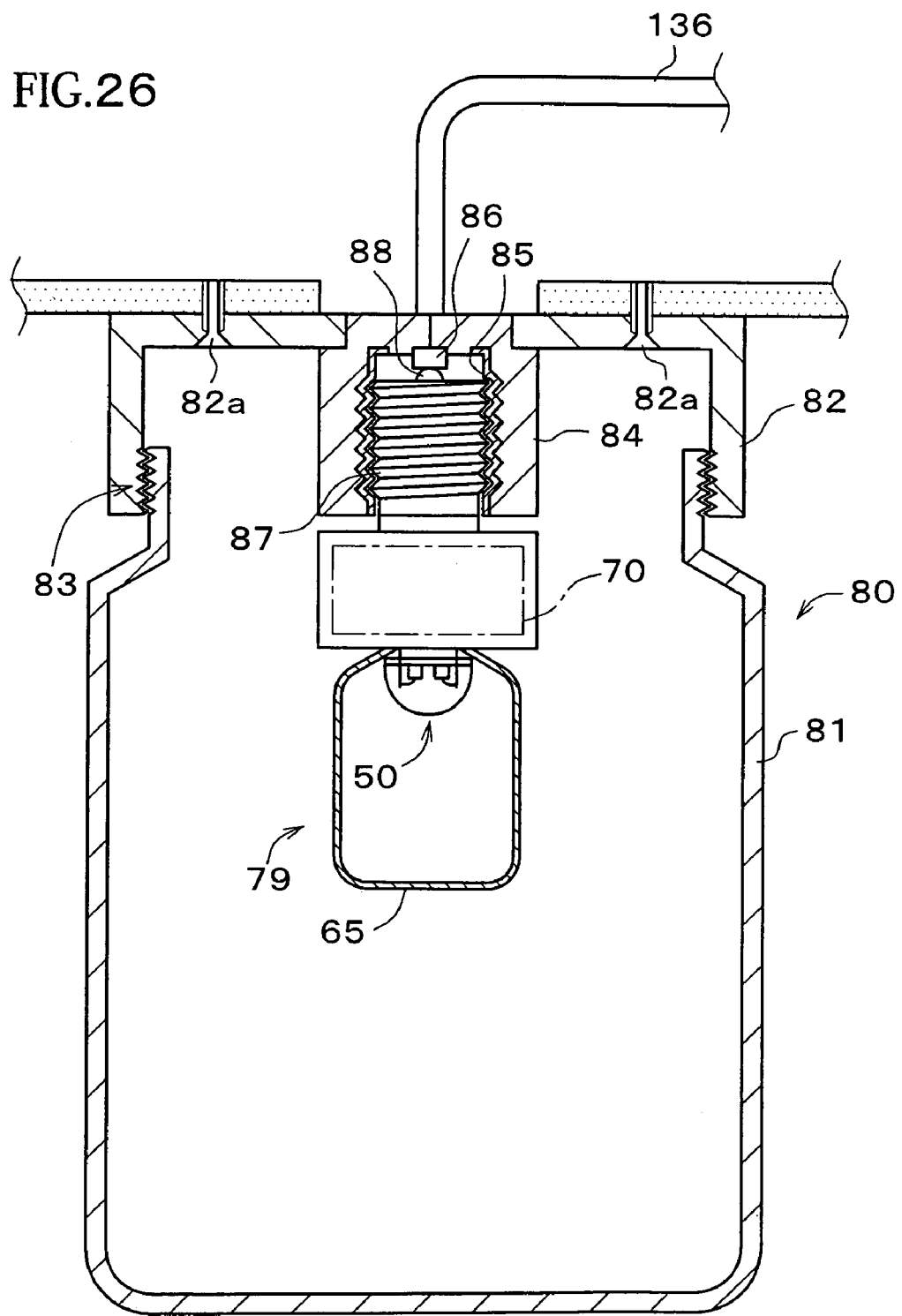
FIG. 26 is a schematic sectional view showing the third embodiment of a lighting apparatus of the invention.

It is also allowable to bond the power supply portion 70 and the light emitting devices 10, 20 (light source module 50) in an inseparable manner to thereby configure a light source unit with voltage conversion function. This configuration allows easy attachment of the light emitting devices 10, 20 to the light bulb socket 84 or the like without using the conversion adapter 150. FIG. 26 shows a practical example thereof. In the electric lamp 80', configured almost similarly to that shown in FIG. 25, the power supply portion 70 and the attachment conductor portion 87 are integrated with the light source module 50 to thereby configure a light source unit 79 with voltage conversion function. Exhausted light source module 50 is replaced together with the power supply portion 70, that is, by the light source unit 79 with voltage conversion function.

The next paragraphs will describe other embodiments of the lighting apparatus of the invention.

Figure 27:
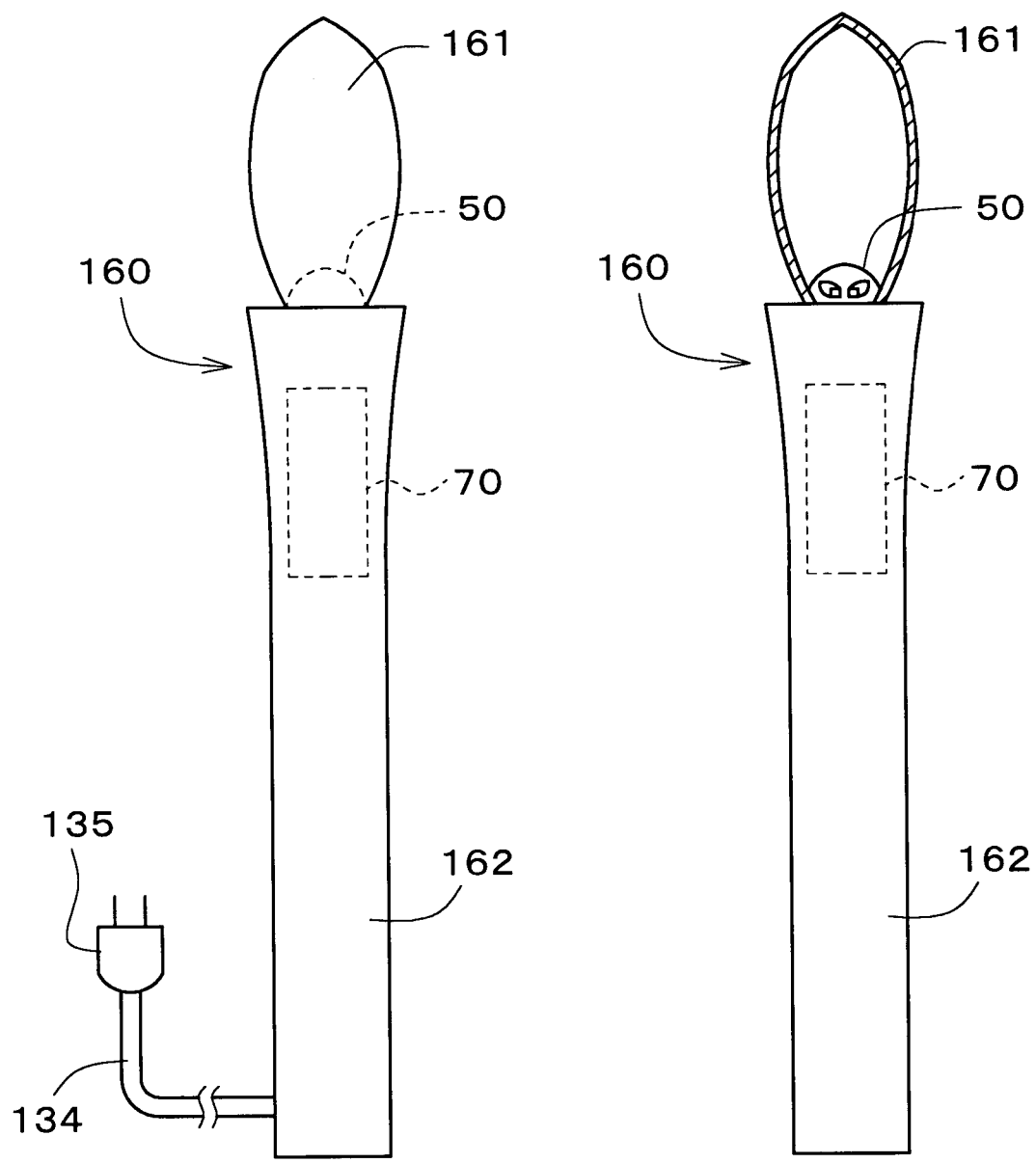
FIG. 27 is a schematic sectional view showing the fourth embodiment of a lighting apparatus of the invention.

FIG. 27 shows an exemplary configuration of a candle-like lighting apparatus 160 as an exemplary light device simulating a combustion light source. The lighting apparatus 160 is designed to operate the light source module 50 by supplying commercial AC through the power supply portion 70. The circuit configuration is fully identical with those shown in FIGS. 23 and 24. The pseudo-continuous spectrum of the light emitting devices 10, 20 of the light source module 50 is such as having a pseudo-combustion-light spectrum simulating a continuous spectrum of combustion light. More specifically, in order to simulate a continuous spectrum of candle light, the active layers 5, 15 are designed so as to obtain a pseudo-continuous spectrum having a further lower color temperature (e.g., 1,500 K or around) than that of the spectrum shown in FIG. 18. The emission color herein is more orangish or reddish. The power supply portion 70 is housed in a body 162 simulating candle stem, the light source module 50 is disposed on the end thereof, and the light source module 50 is covered with a transparent hood 161 simulating an appearance of flame. The power supply portion 70 receives AC from a receptacle through the power cord 134 and power plug 135 drawn out from the body 162.

Figure 28:
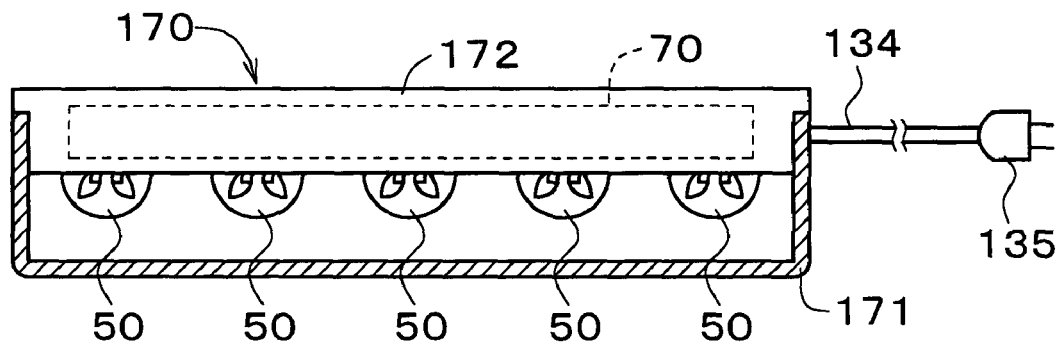
FIG. 28 is a schematic sectional view showing the fifth embodiment of a lighting apparatus of the invention.
Figure 29:
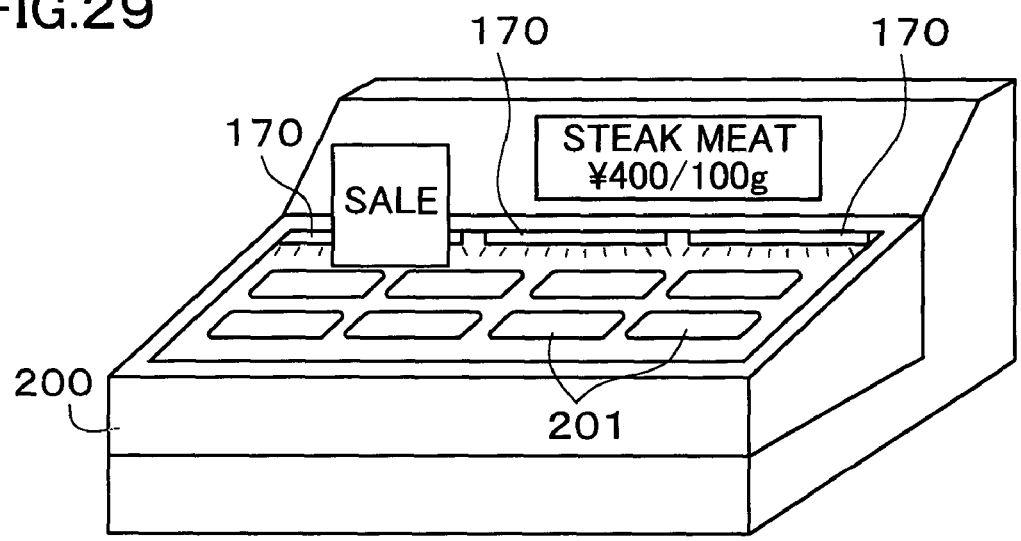
FIG. 29 is a schematic sectional view showing an exemplary application of the lighting apparatus shown in FIG. 28.
Figure 30:
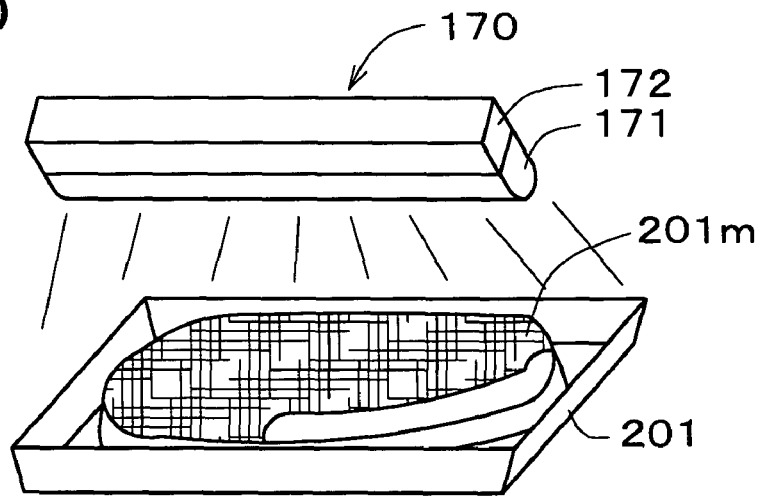
FIG. 30 is a perspective view for explaining effects of the light device shown in FIG. 29.

A lighting apparatus 170 shown in FIG. 28 is configured by linearly aligning a plurality of the light source modules 50 so as to provide an alternative for a straight fluorescent lamp. The power supply portion 70 of the lighting apparatus 170 is housed in a body case 172. The light source modules 50 are disposed at a predetermined intervals on one side face of the body case 172 along the longitudinal direction thereof, and are covered with a transparent hood 171 which is provided to the body case 172 in a detachable manner. Each light source module has a color rendering wavelength region in the red region as indicated by a solid line in FIG. 32. Meat shops and meat-selling floors often have cold show case 200 for displaying commodities 201, where the inner space of which can be lit up by the lighting apparatus 170. Meat 201m illuminated by the lighting apparatus 170 seems to glow in bright red, and can stimulate consumers' will for purchase.

Figure 31:
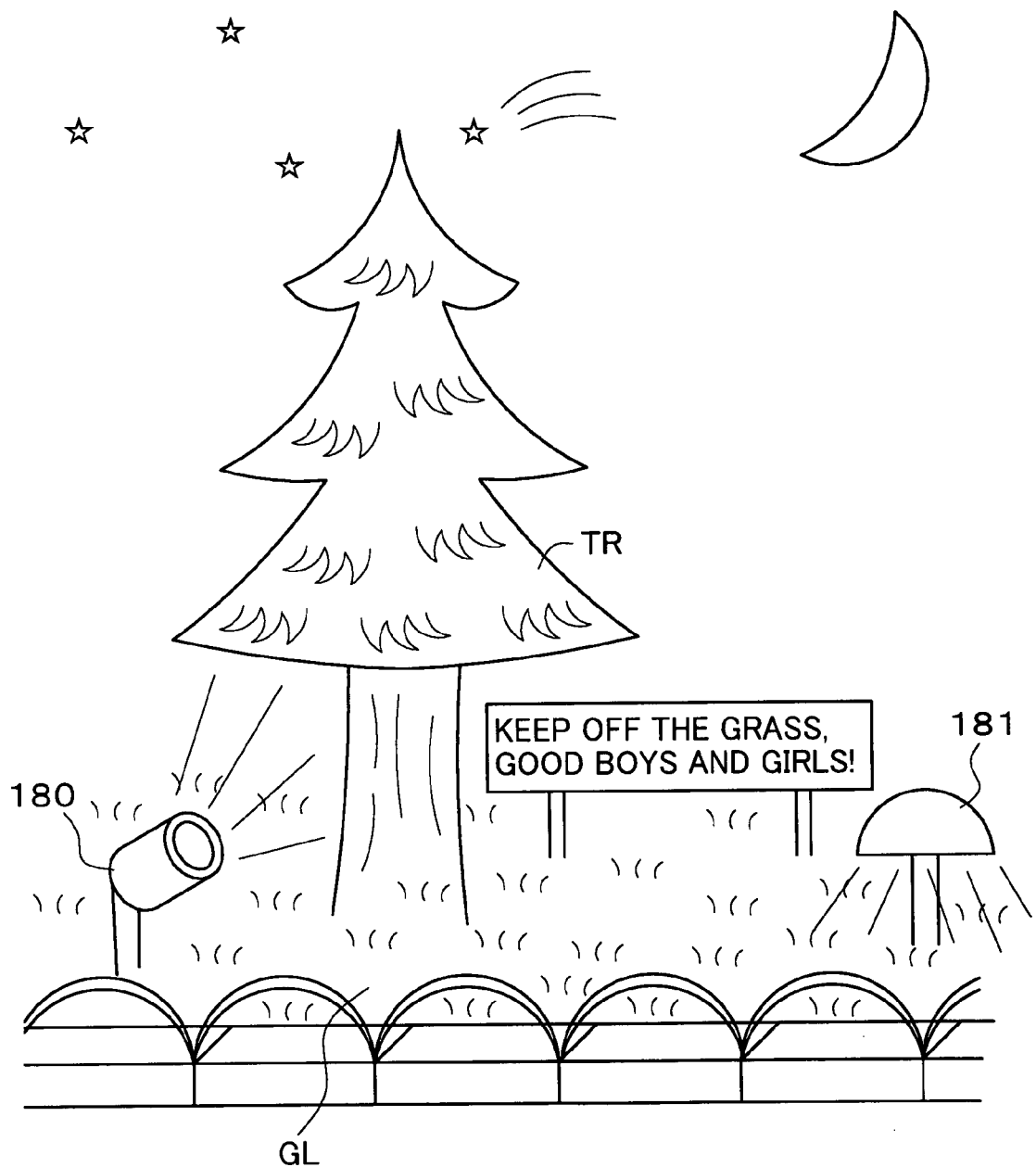
FIG. 31 is a schematic drawing for explaining the sixth embodiment of a lighting apparatus of the invention.

Lighting apparatuses 180, 181 shown in FIG. 31 are designed for use in outdoor lighting, and both of which have the light source modules same as that shown in FIG. 1. The light source modules used herein has a color rendering wavelength region in the green region as indicated by a dashed line in FIG. 32. For example as shown in FIG. 31, plants such as trees TR and lawn GL illuminated by the lighting apparatuses 180, 181 seems to be in bright green, and this ensures beautiful and fantastic light-up of gardens or parks in the nighttime.

What is claimed is:

1. A light emitting device causing emission output of a light having a pseudo-continuous spectrum which is modeled upon is a continuous spectrum obtained from a heat-radiation light source obtained by synthesizing a plurality of emissions differing in peak wavelength so as to ensure an effective wavelength region showing an emission intensity of 5% or more of a reference intensity over a wavelength region of 50 nm or more, the reference intensity being defined as an emission intensity at a peak wavelength in the synthesized spectrum, having a double hetero light emitting layer portion composed of compound semiconductors, the double hetero light emitting layer portion having an active layer comprising a plurality of emission unit layers differing from each other in band gap energy, and the emission output of the light having a pseudo-continuous spectrum is ascribable to a combination of light emission from the individual emission unit layers, wherein the emission unit layers comprise well layers each of which is sandwiched by two barrier layers, and wherein well-depth of well layers in the emission unit layer is a shallower depth in a well having a shorter emission wavelength.

2. The light emitting device as claimed in claim 1, wherein emission intensity of the emission unit layer is adjusted based on thickness and/or the number of the well layers.

3. The light emitting device as claimed in claim 2, wherein the well layers, which contribute to a wavelength region where a larger emission intensity is attained in the pseudo-continuous spectrum, are disposed in a larger thickness and/or the number of layers.

4. The light emitting device as claimed in claim 1, wherein the well emission unit layer has a quantum well structure.

5. The light emitting device as claimed in claim 4, wherein the emission intensity of the emission unit layer having the quantum well structure is adjusted by the number of layers of the well layers.

6. The light emitting device as claimed in claim 4, wherein the well layers have a smaller thickness in the emission unit layer causative of a shorter emission wavelength.

7. The light emitting device as claimed in claim 1, wherein a plurality of repetitive units consisting of a set of emission unit layers having different emission wavelengths are periodically formed in the thickness-wise direction of the active layer.

8. The light emitting device as claimed in claim 7, wherein the double hetero light emitting layer portion is designed so that the main surface thereof on one side of the stacking direction serves as a light extraction surface, and so that the emission unit layer causative of a longer emission wavelength in each of the repetitive unit is disposed more further from the light extraction surface in the thickness-wise direction of the active layer.

9. The light emitting device as claimed in claim 1, wherein the plurality of emission unit layers are aligned according to an order of magnitude of the band gap energy such as ensuring a difference of 0.2 eV or less between every adjacent band gap energies.

10. The light emitting device as claimed in claim 9, wherein the effective wavelength region of the pseudo-continuous spectrum is synthesized by four or more emission unit layers differing in emission wavelength from each other.

11. The light emitting device as claimed in claim 10, wherein the pseudo-continuous spectrum has a ripple ratio of 0.1 or less over the entire portion of the effective wavelength region.

12. The light emitting device as claimed in claim 1, wherein the double hetero light emitting layer portion is composed of $(Al_xGa_{1-x})_yIn_{1-y}P$ (where, $0 \leq x \leq 1$ and $0 \leq y \leq 1$), and the effective wavelength region is ensured within a wavelength region from 550 nm to 670 nm, both ends inclusive.

13. The light emitting device as claimed in claim 1 having a first device and a second device as combined therein, both devices respectively having a double hetero light emitting layer portion composed of compound semiconductors, the first device having an emission wavelength of an emission unit layer contained in an active layer in the double hetero light emitting layer portion of 520 nm to 700 nm, both ends inclusive, and the second device of which having the same of 350 nm to 560 nm, both ends inclusive, and at least either of the first device and second device includes a plurality of the emission unit layers in the active layer.

14. The light emitting device as claimed in claim 13, wherein the double hetero light emitting layer of the first device is composed of $(Al_xGa_{1-x})_yIn_{1-y}P$ (where, $0 \leq x \leq 1$ and $0 \leq y \leq 1$), and the double hetero light emitting layer of the second device is composed of $In_aGa_bAl_{1-a-b}N$ (where, $0 \leq a \leq 1$, $0 \leq b \leq 1$ and $a+b \leq 1$).

15. The light emitting device as claimed in claim 1, wherein the pseudo-continuous spectrum contains no ultraviolet emission components having a wavelength of 350 nm or shorter.

16. The light emitting device as claimed in claim 7, wherein the double hetero light emitting layer portion is designed so that the main surface thereof on one side of the stacking direction serves as a light extraction surface, and so that the emission unit layer in the repetitive unit causative of longer emission wavelength is disposed more further from the light extraction surface in the thickness-wise direction of the active layer.

* * * * *